(12) United States Patent
Macaluso

(10) Patent No.: US 12,160,132 B2
(45) Date of Patent: Dec. 3, 2024

(54) MATABLE ENERGY STORAGE DEVICES

(71) Applicant: Anthony Macaluso, San Diego, CA (US)

(72) Inventor: Anthony Macaluso, San Diego, CA (US)

( * ) Notice: Subject to any disclaimer, the term of this patent is extended or adjusted under 35 U.S.C. 154(b) by 0 days.

(21) Appl. No.: 18/463,875

(22) Filed: Sep. 8, 2023

(65) Prior Publication Data

US 2024/0258823 A1 Aug. 1, 2024

Related U.S. Application Data

(60) Provisional application No. 63/482,289, filed on Jan. 30, 2023.

(51) Int. Cl.

| | |
|---|---|
| *H02J 7/00* | (2006.01) |
| *G01R 31/3835* | (2019.01) |
| *G05B 15/02* | (2006.01) |
| *H01M 10/42* | (2006.01) |
| *H01M 50/269* | (2021.01) |
| *H02J 7/34* | (2006.01) |

(52) U.S. Cl.
CPC .......... *H02J 7/345* (2013.01); *G01R 31/3835* (2019.01); *G05B 15/02* (2013.01); *H01M 10/4264* (2013.01); *H01M 50/269* (2021.01); *H02J 7/0042* (2013.01); *H02J 7/0063* (2013.01); *H02J 7/00712* (2020.01); *H01M 2010/4271* (2013.01); *H01M 2220/20* (2013.01)

(58) Field of Classification Search
CPC ...... H02J 7/345; H02J 7/00712; H02J 7/0042; H02J 7/0063; G01R 31/3835; H01M 50/269; H01M 10/4264; H01M 2010/4271; H01M 2220/20
USPC ....................................................... 320/134
See application file for complete search history.

(56) References Cited

U.S. PATENT DOCUMENTS

| | | | |
|---|---|---|---|
| 1,751,577 | A | 3/1930 | Cole |
| 2,451,965 | A | 10/1948 | Longenecker |
| 2,660,443 | A | 11/1953 | Miller |
| 3,859,589 | A | 1/1975 | Rush |
| 3,891,044 | A | 6/1975 | Tiede |
| 3,943,370 | A | 3/1976 | Watanabe |

(Continued)

FOREIGN PATENT DOCUMENTS

| | | |
|---|---|---|
| CA | 2019025 | 12/1990 |
| CH | 202100372 | 4/2022 |

(Continued)

*Primary Examiner* — Nathaniel R Pelton
(74) *Attorney, Agent, or Firm* — Knobbe, Martens, Olson & Bear, LLP

(57) ABSTRACT

The disclosure is directed to methods and systems for an energy storage system having a capacitor module configured to store energy as an electric field of the capacitor module, the capacitor module including a capacitor terminal, and a battery configured to store energy as a chemical form of the battery, the battery including a battery terminal, and the battery terminal including a cavity. The cavity of the battery terminal is configured to receive a portion of the capacitor terminal to mechanically couple the capacitor module to the battery and to electrically couple the capacitor module to the battery. The electrical coupling allows for energy to flow from the capacitor module to the battery via the terminal to provide voltage to the battery.

24 Claims, 17 Drawing Sheets

(56) References Cited

U.S. PATENT DOCUMENTS

| | | | |
|---|---|---|---|
| 3,961,678 A | 6/1976 | Hirano et al. |
| 3,978,936 A | 9/1976 | Schwartz |
| 3,990,098 A | 11/1976 | Mastrangelo |
| 4,214,160 A | 7/1980 | Fies et al. |
| 4,314,160 A | 2/1982 | Boodman et al. |
| 4,351,405 A | 9/1982 | Fields |
| 4,364,448 A | 12/1982 | Ikuma |
| 4,404,513 A | 9/1983 | Campen |
| 4,476,947 A | 10/1984 | Rynbrandt |
| 4,539,496 A | 9/1985 | Thomas et al. |
| 4,579,188 A | 4/1986 | Facer |
| 4,602,694 A | 7/1986 | Weldin |
| 5,045,646 A | 9/1991 | Musachio |
| 5,078,227 A | 1/1992 | Becker |
| 5,086,857 A | 2/1992 | Dale |
| 5,105,776 A | 4/1992 | Tsuchiya |
| 5,316,101 A | 5/1994 | Gannon |
| 5,412,293 A | 5/1995 | Minezawa et al. |
| 5,491,390 A | 2/1996 | McGreen |
| 5,671,821 A | 9/1997 | McGreen |
| 5,680,907 A | 10/1997 | Weihe |
| 5,710,504 A | 1/1998 | Pascual et al. |
| 5,735,363 A | 4/1998 | Horovitz et al. |
| 5,767,663 A | 6/1998 | Lu |
| 5,921,334 A | 7/1999 | Al-Dokhi |
| 5,982,152 A | 11/1999 | Watanabe |
| 5,992,553 A | 11/1999 | Morrison |
| 6,008,626 A | 12/1999 | Sato |
| 6,064,178 A | 5/2000 | Miller |
| 6,065,557 A | 5/2000 | von Keyserling |
| 6,220,381 B1 | 4/2001 | Damron et al. |
| 6,390,215 B1 | 5/2002 | Kodama |
| 6,502,842 B2 | 1/2003 | Ko |
| 6,531,838 B2 | 3/2003 | Parks |
| 6,703,716 B2 | 3/2004 | Chiu |
| 6,717,280 B1 | 4/2004 | Bienville |
| 6,987,327 B1 | 1/2006 | Lucatero |
| 7,145,256 B2 | 12/2006 | Koharcheck |
| 7,183,746 B1 | 2/2007 | Carter |
| 7,279,799 B1 | 10/2007 | McCauley |
| 7,514,803 B2 | 4/2009 | Wilks |
| 7,547,980 B2 | 6/2009 | Harrison |
| 7,628,236 B1 | 12/2009 | Brown |
| 7,753,010 B2 | 7/2010 | Rutledge |
| 7,913,783 B2 | 3/2011 | Elmaleh |
| 8,063,609 B2 | 11/2011 | Salasoo et al. |
| 8,089,168 B2 | 1/2012 | Chevrette |
| 8,206,263 B2 | 6/2012 | Tsuchikawa |
| 8,253,359 B2 | 8/2012 | Tanaka |
| 8,347,999 B2 | 1/2013 | Koelsch et al. |
| 8,573,346 B2 | 11/2013 | Duignan |
| 8,643,201 B2 | 2/2014 | Scott |
| 8,712,620 B2 | 4/2014 | Jackson |
| 8,723,344 B1 | 5/2014 | Dierickx |
| 8,796,987 B2 * | 8/2014 | Scheucher | H01M 10/482 320/109 |
| 8,872,368 B1 | 10/2014 | Kim et al. |
| 8,907,631 B1 | 12/2014 | Gurries |
| 8,928,281 B2 * | 1/2015 | Murase | H01M 50/51 320/122 |
| 9,048,513 B2 | 6/2015 | Butzmann |
| 9,136,729 B2 * | 9/2015 | Ashinghurst | H02J 50/80 |
| 9,236,761 B2 | 1/2016 | Strothmann |
| 9,242,698 B2 | 1/2016 | Frieden |
| 9,321,357 B2 | 4/2016 | Caldeira et al. |
| 9,376,971 B2 | 6/2016 | Luther et al. |
| 9,415,660 B2 | 8/2016 | Koelsch |
| 9,457,666 B2 | 10/2016 | Caldeira et al. |
| 9,575,743 B1 | 2/2017 | Chun |
| 9,656,660 B2 | 5/2017 | Baliff |
| 9,726,240 B2 | 8/2017 | David et al. |
| 9,793,833 B1 | 10/2017 | Johnson |
| 9,816,475 B1 | 11/2017 | Buchanan et al. |
| 9,981,553 B2 | 5/2018 | Schafer et al. |
| 10,077,056 B1 | 9/2018 | Fields et al. |
| 10,077,752 B1 | 9/2018 | Lee et al. |
| 10,157,050 B2 | 12/2018 | Kotani et al. |
| 10,252,727 B1 | 4/2019 | Braun |
| 10,293,702 B2 | 5/2019 | Tu et al. |
| 10,513,180 B2 | 12/2019 | Quill |
| 10,586,024 B1 | 3/2020 | Patton |
| 10,664,917 B1 | 5/2020 | Wasserman |
| 10,666,077 B1 | 5/2020 | Dharia |
| 10,787,089 B1 * | 9/2020 | Macaluso | B60K 25/08 |
| 10,795,380 B1 | 10/2020 | Patton |
| 10,797,564 B1 | 10/2020 | Griggs |
| 10,850,713 B2 | 12/2020 | O'Hara |
| 10,889,186 B2 | 1/2021 | Schutt |
| 10,903,679 B2 | 1/2021 | Schmalzrieth et al. |
| 11,007,878 B2 | 5/2021 | Kamino et al. |
| 11,072,254 B2 | 7/2021 | Macaluso |
| 11,117,481 B2 | 9/2021 | Macaluso |
| 11,130,415 B2 | 9/2021 | Macaluso |
| 11,133,729 B2 | 9/2021 | Macaluso |
| 11,159,042 B2 | 10/2021 | Familiant et al. |
| 11,222,750 B1 | 1/2022 | Macaluso |
| 11,289,974 B2 | 3/2022 | Macaluso |
| 11,299,054 B2 | 4/2022 | Macaluso |
| 11,318,856 B2 | 5/2022 | Macaluso |
| 11,322,311 B2 | 5/2022 | Macaluso |
| 11,362,525 B2 | 6/2022 | Feng |
| 11,368,031 B2 | 6/2022 | Griffiths et al. |
| 11,431,225 B2 | 8/2022 | Macaluso |
| 11,432,123 B2 | 8/2022 | Macaluso |
| 11,458,853 B2 | 10/2022 | Macaluso |
| 11,472,306 B1 | 10/2022 | Macaluso |
| 11,548,399 B1 | 1/2023 | Macaluso |
| 11,551,486 B1 | 1/2023 | Everett et al. |
| 11,577,606 B1 | 2/2023 | Macaluso |
| 11,587,740 B2 | 2/2023 | Macaluso |
| 11,618,332 B1 | 4/2023 | Macaluso |
| 11,626,775 B2 | 4/2023 | Macaluso |
| 11,627,449 B2 | 4/2023 | Macaluso |
| 11,628,724 B1 | 4/2023 | Macaluso |
| 11,641,572 B2 | 5/2023 | Macaluso |
| 11,685,276 B2 | 6/2023 | Macaluso |
| 11,722,869 B2 | 8/2023 | Macaluso |
| 11,738,641 B1 | 8/2023 | Macaluso |
| 11,757,332 B2 | 9/2023 | Macaluso |
| 11,785,433 B2 | 10/2023 | Macaluso |
| 11,837,411 B2 | 12/2023 | Macaluso |
| 11,897,355 B2 | 2/2024 | Macaluso |
| 11,919,387 B1 | 3/2024 | Macaluso |
| 11,938,825 B2 | 3/2024 | Sukhatankar et al. |
| 11,955,875 B1 | 4/2024 | Macaluso |
| 11,970,073 B2 | 4/2024 | Macaluso |
| 12,003,167 B1 | 6/2024 | Macaluso |
| 12,090,844 B2 | 9/2024 | Macaluso |
| 12,096,324 B2 | 9/2024 | Macaluso |
| 2003/0071464 A1 | 4/2003 | Chiu |
| 2003/0139859 A1 | 7/2003 | Hanada |
| 2003/0184258 A1 | 10/2003 | VonderHaar |
| 2003/0222502 A1 | 12/2003 | Takahashi |
| 2004/0012205 A1 | 1/2004 | Sua-An |
| 2004/0245783 A1 | 12/2004 | Gilbreth |
| 2004/0262062 A1 | 12/2004 | Berbari et al. |
| 2005/0093370 A1 | 5/2005 | Amano et al. |
| 2005/0224263 A1 | 10/2005 | Vasilantone |
| 2006/0238258 A1 | 10/2006 | D'Amore |
| 2007/0013244 A1 | 1/2007 | Kinkaid |
| 2007/0024266 A1 | 2/2007 | Yurgil |
| 2007/0075677 A1 | 4/2007 | Alvarez-Troncoso |
| 2007/0090702 A1 | 4/2007 | Schiller |
| 2007/0164693 A1 | 7/2007 | King |
| 2007/0187957 A1 | 8/2007 | Harrison |
| 2007/0208468 A1 | 9/2007 | Sankaran et al. |
| 2008/0066979 A1 | 3/2008 | Carter |
| 2008/0215700 A1 | 9/2008 | Pillar et al. |
| 2008/0223637 A1 | 9/2008 | Bartilson |
| 2008/0281663 A1 * | 11/2008 | Hakim | H02J 3/466 705/7.25 |
| 2008/0289890 A1 | 11/2008 | Stoltzfus |
| 2008/0297109 A1 | 12/2008 | Sandberg et al. |
| 2009/0033254 A1 | 2/2009 | Nagashima et al. |

(56) References Cited

U.S. PATENT DOCUMENTS

| | | |
|---|---|---|
| 2009/0079417 A1 | 3/2009 | Mort et al. |
| 2009/0145674 A1 | 6/2009 | Lee |
| 2009/0168305 A1 | 7/2009 | Fleig et al. |
| 2009/0194998 A1 | 8/2009 | Lin |
| 2009/0230766 A1 | 9/2009 | Miyama |
| 2009/0250276 A1 | 10/2009 | Goodwin et al. |
| 2009/0256450 A1 | 10/2009 | Chevrette |
| 2010/0001866 A1 | 1/2010 | Ichikawa |
| 2010/0019718 A1 | 1/2010 | Salasoo et al. |
| 2010/0076825 A1 | 3/2010 | Sato |
| 2010/0116574 A1 | 5/2010 | Gilmore |
| 2010/0117600 A1 | 5/2010 | Fazakas |
| 2010/0164334 A1 | 7/2010 | Schiller |
| 2010/0168945 A1 | 7/2010 | Ohno |
| 2010/0222952 A1 | 9/2010 | Yamaguchi |
| 2010/0270810 A1 | 10/2010 | Liebermann et al. |
| 2010/0327600 A1 | 12/2010 | Koelsch |
| 2011/0012560 A1 | 1/2011 | Sakakibara et al. |
| 2011/0014501 A1 | 1/2011 | Scheucher |
| 2011/0025068 A1 | 2/2011 | Campbell |
| 2011/0089760 A1 | 4/2011 | Castelaz et al. |
| 2011/0100735 A1 | 5/2011 | Flett |
| 2011/0106329 A1 | 5/2011 | Donnelly et al. |
| 2011/0140518 A1 | 6/2011 | Hattori |
| 2011/0163717 A1 | 7/2011 | Gale |
| 2011/0167455 A1 | 7/2011 | Gao |
| 2011/0189507 A1 | 8/2011 | Reis |
| 2011/0200193 A1 | 8/2011 | Blitz et al. |
| 2011/0302078 A1 | 12/2011 | Failing |
| 2011/0320074 A1 | 12/2011 | Erlston et al. |
| 2012/0012406 A1 | 1/2012 | Stoicoviciu |
| 2012/0037438 A1 | 2/2012 | Schultz |
| 2012/0054095 A1 | 3/2012 | Lesandro et al. |
| 2012/0068537 A1 | 3/2012 | Hintz et al. |
| 2012/0129577 A1* | 5/2012 | Vaknin .................. H02J 7/0044 455/573 |
| 2012/0139487 A1 | 6/2012 | Kim |
| 2012/0237799 A1 | 9/2012 | Jiang |
| 2012/0309455 A1 | 12/2012 | Klose et al. |
| 2012/0330486 A1 | 12/2012 | Jingu |
| 2013/0015668 A1 | 1/2013 | Chang et al. |
| 2013/0067253 A1 | 3/2013 | Tsuda |
| 2013/0081886 A1 | 4/2013 | Jaberian |
| 2013/0096759 A1 | 4/2013 | Breton et al. |
| 2013/0119665 A1 | 5/2013 | Berbari |
| 2013/0257144 A1 | 10/2013 | Caldeira et al. |
| 2013/0257145 A1 | 10/2013 | Caldeira et al. |
| 2013/0261907 A1 | 10/2013 | McQuade |
| 2013/0266826 A1 | 10/2013 | Cowperthwaite |
| 2013/0307479 A1 | 11/2013 | Kim |
| 2013/0332014 A1 | 12/2013 | Jackson |
| 2014/0001905 A1 | 1/2014 | Schawitsch |
| 2014/0091573 A1 | 4/2014 | Berbari |
| 2014/0132155 A1 | 5/2014 | Strothmann |
| 2014/0197780 A1 | 7/2014 | Imamura |
| 2014/0210398 A1 | 7/2014 | Powell |
| 2014/0244082 A1 | 8/2014 | Caron |
| 2014/0266004 A1 | 9/2014 | Andrews, Jr. |
| 2014/0266070 A1 | 9/2014 | Kurtzman |
| 2014/0283092 A1 | 9/2014 | Mowatt et al. |
| 2014/0285209 A1 | 9/2014 | Stichowski et al. |
| 2014/0350764 A1 | 11/2014 | Arai et al. |
| 2014/0368041 A1 | 12/2014 | Tu et al. |
| 2015/0008867 A1 | 1/2015 | Smychkovich |
| 2015/0014991 A1 | 1/2015 | Al Jaeedi et al. |
| 2015/0089981 A1 | 4/2015 | Renfro |
| 2015/0210287 A1 | 7/2015 | Penilla et al. |
| 2015/0222553 A1 | 8/2015 | Macdonald et al. |
| 2015/0249362 A1 | 9/2015 | Bridgelall et al. |
| 2015/0260835 A1 | 9/2015 | Widmer et al. |
| 2015/0262154 A1 | 9/2015 | Wolfson |
| 2015/0343909 A1 | 12/2015 | Hikiri |
| 2015/0346233 A1 | 12/2015 | Slepov |
| 2015/0347121 A1 | 12/2015 | Harumoto |
| 2015/0363855 A1 | 12/2015 | Wu et al. |
| 2016/0034952 A1 | 2/2016 | Parkin et al. |
| 2016/0071338 A1 | 3/2016 | McQuade et al. |
| 2016/0089981 A1 | 3/2016 | Kodawara |
| 2016/0111907 A1 | 4/2016 | Lynds |
| 2016/0144720 A1 | 5/2016 | Nakabayashi |
| 2016/0164373 A1 | 6/2016 | Liao et al. |
| 2016/0189311 A1 | 6/2016 | Erickson et al. |
| 2016/0236578 A1 | 8/2016 | Liao |
| 2016/0243960 A1 | 8/2016 | Wood |
| 2016/0297317 A1 | 10/2016 | Huang et al. |
| 2016/0298589 A1 | 10/2016 | Setterberg |
| 2016/0348788 A1 | 12/2016 | Lemmers |
| 2017/0036551 A1 | 2/2017 | Wu |
| 2017/0063124 A1 | 3/2017 | Yu et al. |
| 2017/0077534 A1 | 3/2017 | Guidry et al. |
| 2017/0086084 A1 | 3/2017 | Jarvis |
| 2017/0117720 A1 | 4/2017 | Yung |
| 2017/0131999 A1 | 5/2017 | Dolby et al. |
| 2017/0142766 A1 | 5/2017 | Kim |
| 2017/0176540 A1 | 6/2017 | Omi |
| 2017/0191459 A1 | 7/2017 | Zhang |
| 2017/0217442 A1 | 8/2017 | Rios, III |
| 2017/0302094 A1 | 10/2017 | Lynds |
| 2017/0363433 A1 | 12/2017 | Tennent et al. |
| 2017/0366017 A1 | 12/2017 | Clay et al. |
| 2017/0366112 A1 | 12/2017 | Zhou |
| 2018/0009329 A1 | 1/2018 | Tellez |
| 2018/0012196 A1 | 1/2018 | Ricci |
| 2018/0083469 A1 | 3/2018 | Bauer et al. |
| 2018/0126866 A1 | 5/2018 | Nozawa |
| 2018/0154779 A1 | 6/2018 | Chol |
| 2018/0156144 A1 | 6/2018 | Inoue |
| 2018/0166750 A1 | 6/2018 | Chang |
| 2018/0189049 A1 | 7/2018 | Madrid |
| 2018/0198846 A1 | 7/2018 | Srinivasan |
| 2018/0204173 A1 | 7/2018 | Painter et al. |
| 2018/0204253 A1 | 7/2018 | Painter et al. |
| 2018/0204281 A1 | 7/2018 | Painter et al. |
| 2018/0205242 A1 | 7/2018 | Kelly-Morgan et al. |
| 2018/0215272 A1 | 8/2018 | Vitullo et al. |
| 2018/0254732 A1 | 9/2018 | Smolenaers |
| 2018/0312159 A1 | 11/2018 | Jent, II |
| 2018/0328745 A1 | 11/2018 | Nagy et al. |
| 2018/0351397 A1 | 12/2018 | Aharoni |
| 2018/0370537 A1 | 12/2018 | Wu |
| 2019/0001804 A1 | 1/2019 | Wilhide |
| 2019/0004580 A1 | 1/2019 | Wilhide |
| 2019/0044359 A1 | 2/2019 | Gordon et al. |
| 2019/0077254 A1 | 3/2019 | Stanley |
| 2019/0103639 A1* | 4/2019 | Guglielmo .......... H01M 50/249 |
| 2019/0140245 A1 | 5/2019 | Mensch |
| 2019/0176802 A1 | 6/2019 | Kim |
| 2019/0184843 A1 | 6/2019 | Jung et al. |
| 2019/0199104 A1 | 6/2019 | Shim |
| 2019/0202429 A1 | 7/2019 | Richter |
| 2019/0212997 A1 | 7/2019 | Sangameswaran et al. |
| 2019/0215376 A1 | 7/2019 | Kang |
| 2019/0217720 A1 | 7/2019 | Treharne et al. |
| 2019/0245375 A1 | 8/2019 | Schmalzrieth et al. |
| 2019/0263385 A1 | 8/2019 | Zhou |
| 2019/0292973 A1 | 9/2019 | Jiang et al. |
| 2019/0308510 A1 | 10/2019 | Beaurepaire |
| 2019/0329650 A1 | 10/2019 | Quill |
| 2019/0351895 A1 | 11/2019 | Ben-Ari |
| 2019/0351899 A1 | 11/2019 | Adam |
| 2019/0351948 A1 | 11/2019 | Derissaint |
| 2019/0359080 A1 | 11/2019 | Hellgren |
| 2019/0362922 A1 | 11/2019 | Bae et al. |
| 2019/0383627 A1 | 12/2019 | Nangeroni et al. |
| 2020/0006716 A1 | 1/2020 | Wagoner |
| 2020/0184591 A1 | 1/2020 | Balu et al. |
| 2020/0039379 A1 | 2/2020 | Schlosser |
| 2020/0063640 A1 | 2/2020 | Lee |
| 2020/0094695 A1 | 3/2020 | Bowman |
| 2020/0101858 A1 | 4/2020 | Kuroda |
| 2020/0136414 A1 | 4/2020 | Patsos |
| 2020/0174780 A1 | 6/2020 | Gintz |
| 2020/0186620 A1 | 6/2020 | Golgiri |
| 2020/0202645 A1 | 6/2020 | Gintz |

(56) References Cited

U.S. PATENT DOCUMENTS

| | | |
|---|---|---|
| 2020/0203986 A1 | 6/2020 | Barreau |
| 2020/0204702 A1 | 6/2020 | Park |
| 2020/0207209 A1 | 7/2020 | Engel |
| 2020/0226850 A1 | 7/2020 | Bower |
| 2020/0238929 A1 | 7/2020 | Wippler |
| 2020/0241555 A1 | 7/2020 | Dogishi |
| 2020/0244088 A1* | 7/2020 | Will .................... H02J 7/02 |
| 2020/0249822 A1 | 8/2020 | Penilla |
| 2020/0258325 A1 | 8/2020 | Maria |
| 2020/0276904 A1 | 9/2020 | Deaton |
| 2020/0277021 A1 | 9/2020 | Biderman |
| 2020/0294401 A1 | 9/2020 | Kerecsen |
| 2020/0295412 A1 | 9/2020 | Chen |
| 2020/0324763 A1 | 10/2020 | Switkes et al. |
| 2020/0353839 A1 | 11/2020 | Tarchinski et al. |
| 2020/0353882 A1 | 11/2020 | Beiser |
| 2020/0376967 A1 | 12/2020 | Furukawa |
| 2020/0381784 A1 | 12/2020 | Yamamoto |
| 2020/0384879 A1 | 12/2020 | Ebisu et al. |
| 2021/0001737 A1 | 1/2021 | Hoess et al. |
| 2021/0046833 A1 | 2/2021 | Macaluso |
| 2021/0065073 A1 | 3/2021 | Maeda et al. |
| 2021/0080943 A1 | 3/2021 | Iwamoto et al. |
| 2021/0110323 A1 | 4/2021 | Munoz et al. |
| 2021/0157571 A1 | 5/2021 | Ogawa |
| 2021/0167988 A1 | 6/2021 | Harata et al. |
| 2021/0173411 A1 | 6/2021 | Rao et al. |
| 2021/0173635 A1 | 6/2021 | Shin |
| 2021/0183175 A1 | 6/2021 | Dunger |
| 2021/0188101 A1 | 6/2021 | Abu Qahouq et al. |
| 2021/0188115 A1 | 6/2021 | Kazuno |
| 2021/0197687 A1 | 7/2021 | Searcy |
| 2021/0213952 A1 | 7/2021 | Willison |
| 2021/0229687 A1 | 7/2021 | Hashimoto et al. |
| 2021/0284043 A1 | 9/2021 | Wang et al. |
| 2021/0312544 A1 | 10/2021 | Inoue et al. |
| 2021/0313121 A1 | 10/2021 | Macaluso |
| 2021/0334913 A1 | 10/2021 | Klein |
| 2021/0347225 A1 | 11/2021 | Johnson et al. |
| 2021/0405996 A1 | 12/2021 | Takatsuna et al. |
| 2022/0016941 A1 | 1/2022 | Sams |
| 2022/0028625 A1 | 1/2022 | Macaluso |
| 2022/0028627 A1 | 1/2022 | Macaluso |
| 2022/0050143 A1 | 2/2022 | Maeda et al. |
| 2022/0052582 A1 | 2/2022 | Giannotta |
| 2022/0105793 A1 | 4/2022 | Sukhatankar |
| 2022/0109314 A1 | 4/2022 | Pena |
| 2022/0111758 A1 | 4/2022 | Ijaz et al. |
| 2022/0144258 A1 | 5/2022 | Lind |
| 2022/0179641 A1 | 6/2022 | Harata et al. |
| 2022/0179644 A1 | 6/2022 | Harata et al. |
| 2022/0204012 A1 | 6/2022 | Ko |
| 2022/0212638 A1 | 7/2022 | Georgeson |
| 2022/0229446 A1 | 7/2022 | Switkes |
| 2022/0247201 A1 | 8/2022 | Chen |
| 2022/0253301 A1 | 8/2022 | Harata et al. |
| 2022/0261836 A1 | 8/2022 | Kimomura et al. |
| 2022/0270177 A1 | 8/2022 | Chintakindi |
| 2022/0301775 A1 | 9/2022 | Macaluso |
| 2022/0314837 A1 | 10/2022 | Gupta |
| 2022/0328271 A1 | 10/2022 | Patwardhan et al. |
| 2022/0329019 A1 | 10/2022 | Lanjekar et al. |
| 2022/0334818 A1 | 10/2022 | McFarland |
| 2022/0334822 A1 | 10/2022 | Sakakibara et al. |
| 2022/0340035 A1 | 10/2022 | Kim et al. |
| 2022/0374027 A1 | 11/2022 | Watts et al. |
| 2022/0399581 A1 | 12/2022 | Wood |
| 2022/0402390 A1 | 12/2022 | Smolenaers |
| 2023/0005305 A1 | 1/2023 | Sakurai et al. |
| 2023/0038222 A1 | 2/2023 | Howell |
| 2023/0068432 A1 | 3/2023 | Upadhyay et al. |
| 2023/0104789 A1 | 4/2023 | Inui |
| 2023/0123166 A1* | 4/2023 | Deighton ............ H01M 10/425 320/114 |
| 2023/0125192 A1 | 4/2023 | Macaluso |
| 2023/0130832 A1 | 4/2023 | Dunn |
| 2023/0142500 A1* | 5/2023 | Marzoughi ........... H02J 7/0048 320/137 |
| 2023/0143096 A1 | 5/2023 | Macaluso |
| 2023/0150380 A1 | 5/2023 | Macaluso |
| 2023/0154692 A1 | 5/2023 | Macaluso |
| 2023/0155401 A1* | 5/2023 | Kuranuki ................ B60L 53/65 307/10.7 |
| 2023/0171574 A1 | 6/2023 | Macaluso |
| 2023/0187145 A1 | 6/2023 | Macaluso |
| 2023/0187757 A1 | 6/2023 | Pouyadou |
| 2023/0261509 A1* | 8/2023 | Dalal .................. H02J 7/00032 307/11 |
| 2023/0286400 A1 | 9/2023 | Macaluso |
| 2023/0302962 A1* | 9/2023 | Couture ................ B60L 58/20 700/13 |
| 2023/0336055 A1 | 10/2023 | Macaluso |
| 2024/0087810 A1 | 3/2024 | Macaluso |
| 2024/0109442 A1 | 4/2024 | Macaluso |
| 2024/0174107 A1 | 5/2024 | Macaluso |
| 2024/0178722 A1 | 5/2024 | Macaluso |
| 2024/0258824 A1 | 8/2024 | Macaluso |
| 2024/0286507 A1 | 8/2024 | Macaluso |
| 2024/0322647 A1 | 9/2024 | Macaluso |

FOREIGN PATENT DOCUMENTS

| | | |
|---|---|---|
| CN | 202294336 U | 7/2012 |
| CN | 102963263 | 3/2013 |
| CN | 108473063 | 8/2013 |
| CN | 106846153 | 6/2017 |
| CN | 107117038 | 9/2017 |
| CN | 108539841 | 9/2018 |
| CN | 110549902 | 12/2019 |
| CN | 110633815 | 12/2019 |
| CN | 107804326 | 1/2020 |
| CN | 110889601 | 3/2020 |
| CN | 111954615 | 11/2020 |
| CN | 112977043 | 6/2021 |
| CN | 113479111 | 10/2021 |
| CN | 215398141 | 1/2022 |
| DE | 102017008723 | 5/2018 |
| DE | 102019220366 | 6/2021 |
| DE | 102011018457 | 1/2022 |
| EP | 1 253 698 | 10/2002 |
| EP | 3 246 776 B1 | 11/2020 |
| EP | 2 681 512 | 1/2021 |
| ES | 2880816 T3 | 11/2021 |
| GB | 2325201 | 11/1998 |
| GB | 2511831 | 9/2014 |
| GB | 2585496 | 1/2021 |
| JP | 2002-257026 | 9/2002 |
| JP | 2003-278633 | 10/2003 |
| JP | 2011-132873 | 7/2011 |
| JP | 2015-027164 | 2/2015 |
| JP | 2016-170600 | 9/2016 |
| JP | 6687274 | 4/2020 |
| KR | 2020-0020016 | 2/2020 |
| KR | 102266609 | 6/2021 |
| WO | WO 09/149769 | 12/2009 |
| WO | WO 10/133863 | 11/2010 |
| WO | WO 11/078748 | 6/2011 |
| WO | WO 11/148531 | 12/2011 |
| WO | WO 17/030354 | 2/2017 |
| WO | WO 17/057528 | 4/2017 |
| WO | WO 17/213079 | 12/2017 |
| WO | WO 18/046979 | 3/2018 |
| WO | WO 18/083279 | 5/2018 |
| WO | WO 19/117894 | 6/2019 |
| WO | WO 19/145777 | 8/2019 |
| WO | WO 19/219997 | 11/2019 |
| WO | WO 19/240783 | 12/2019 |
| WO | WO 20/191367 | 9/2020 |
| WO | WO 21/187071 | 9/2021 |
| WO | WO 22/015017 | 1/2022 |
| WO | WO 22/132807 | 6/2022 |

(56) References Cited

FOREIGN PATENT DOCUMENTS

| WO | WO 22/219510 | 10/2022 |
| WO | WO 23/160878 | 8/2023 |
| WO | WO 24/002525 | 1/2024 |

\* cited by examiner

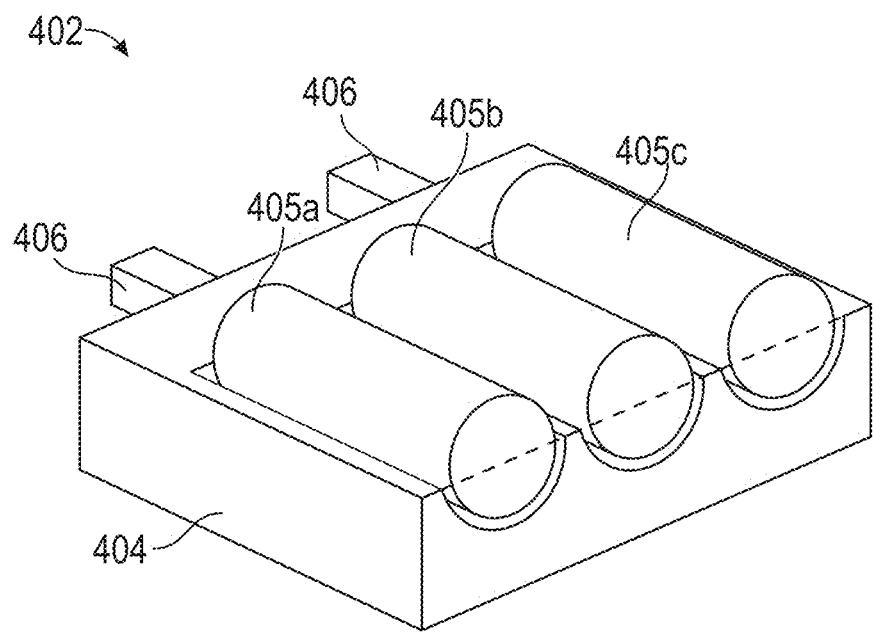
FIG. 4A
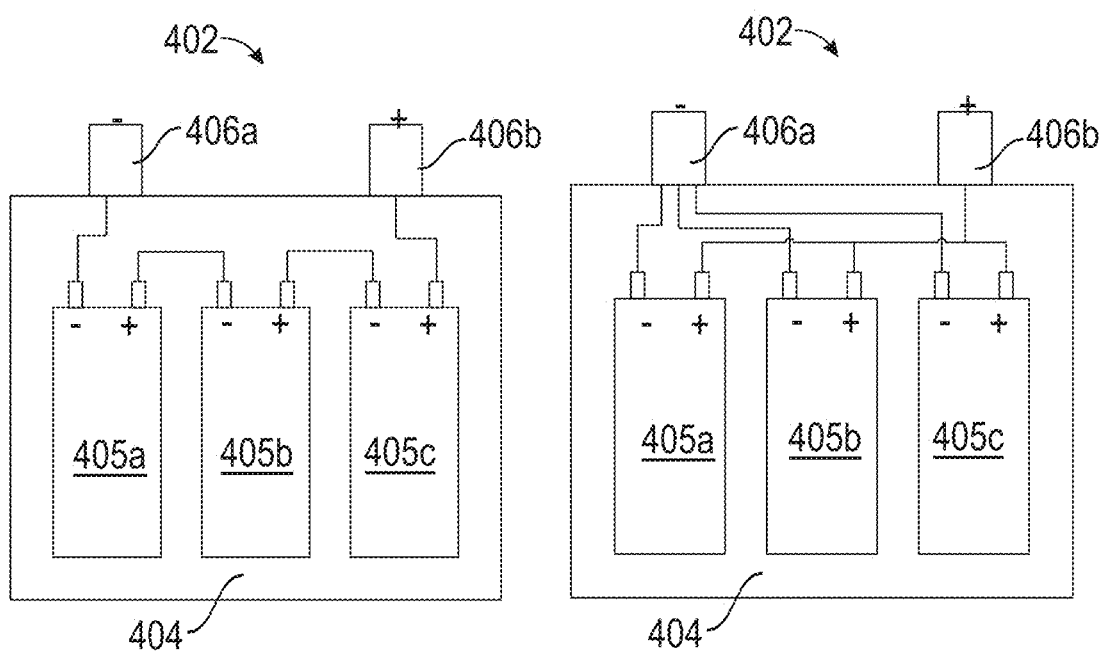
FIG. 4B  FIG. 4C

MATABLE ENERGY STORAGE DEVICES

CROSS REFERENCE TO RELATED APPLICATIONS

This application claims benefit of priority to U.S. Provisional Patent No. 63/482,289 filed Jan. 30, 2023. The disclosures of each of the aforementioned application(s) are incorporated herein in their entireties for all purposes. Any and all applications for which a foreign or domestic priority claim is identified in the Application Data Sheet as filed with the present application are hereby incorporated by reference under 37 CFR 1.57 for all purposes and for all that they contain.

FIELD OF THE DISCLOSURE

The present disclosure relates to generally to systems and devices for receiving, storing and providing energy.

BACKGROUND

Existing energy storage devices, such as batteries and capacitors, can be useful for storing energy but may have many undesirable limitations. For example, batteries such as lithium-ion batteries are resilient to self-discharge but often require long charge times (e.g., 12-14 hours). In contrast, capacitors, such as ultracapacitors and supercapacitors are capable of being charged quickly (i.e., faster than batteries) but may be much less resistant to self-discharge than batteries. For example, ultracapacitors/supercapacitors may lose as much as 10-20% of their charge per day due to self-discharge. Further, although ultracapacitors/supercapacitors may be capable of withstanding more charge-discharge cycles than batteries without losing operational functionality, ultracapacitors/supercapacitors may not be capable of storing as much energy per weight as batteries.

In addition, batteries, such as lithium-ion batteries present many environmental problems. For example, mining and disposing of lithium are both environmentally destructive. Furthermore, lithium-ion batteries are capable of catching fire and burning at high temperatures for long amounts of time, which is also environmentally destructive and hazardous to human health.

SUMMARY

Various implementations of systems, methods and devices within the scope of the appended claims each have several aspects, no single one of which is solely responsible for the desirable attributes described herein. Without limiting the scope of the appended claims, the description below describes some prominent features.

Details of one or more implementations of the subject matter described in this specification are set forth in the accompanying drawings and the description below. Other features, aspects, and advantages will become apparent from the description, the drawings, and the claims. Note that relative dimensions of the following figures may not be drawn to scale.

The present disclosure provides an energy storage assembly. The energy storage assembly can include a first energy storage component and a second energy storage component. The first energy storage component can include an elongate member positioned along a surface of the first energy storage component. The second energy storage component can include an elongated cavity disposed along a surface of the second energy storage component. The elongated cavity can receive the elongate member to mechanically couple the first energy storage component to the second energy storage component to position the surface of the first energy storage component adjacent to the surface of the second energy storage component.

In some implementations, the elongate member is configured to move along a longitudinal axis of the elongated cavity along a length of the elongated cavity.

In some implementations, the elongate member is configured to move along an axis of the elongated cavity that is perpendicular to a longitudinal axis of the elongated cavity.

In some implementations, the elongated cavity is configured to prevent the elongated member from moving along an axis of the elongated cavity that is perpendicular to a longitudinal axis of the elongated cavity.

In some implementations, a cross section of the elongate member is asymmetrical across a first axis.

In some implementations, a cross section of the elongate member is trapezoidal including a narrow portion and a wide portion.

In some implementations, the first energy storage component further includes an elongated cavity disposed along another surface of the first energy storage component, wherein the second energy storage component further includes an elongate member positioned along another surface of the second energy storage component.

In some implementations, the first energy storage component includes a handle.

In some implementations, the first energy storage component further includes a magnet, wherein the second energy storage component further includes a magnet configured to magnetically attract the magnet of the first energy storage component.

In some implementations, the elongate member includes a magnet, wherein the elongated cavity includes a magnet configured to magnetically attract the magnet of a terminal.

In some implementations, an energy storage assembly can further include a diode configured to allow energy to flow from the first energy storage component to the second energy storage component and prevent energy from flowing from the first energy storage component to the second energy storage component.

In some implementations, an energy storage assembly can further include a switch configured to allow energy to flow from the first energy storage component to the second energy storage component in an open state, and prevent energy from flowing from the first energy storage component to the second energy storage component in a closed state.

In some implementations, the elongated cavity is further configured to receive the elongate member to electrically couple the first energy storage component to the second energy storage component.

In some implementations, the first energy storage component further includes an electrical terminal, wherein the second energy storage component further includes an electrical terminal, wherein the elongated cavity is further configured to receive the elongate member to mechanically couple the electrical terminal of the first energy storage component to the electrical terminal of the second energy storage component to electrically couple the first energy storage component to the second energy storage component.

In some implementations, the elongate member includes an electrical terminal, wherein the elongated cavity includes an electrical terminal, wherein the elongated cavity is further configured to receive the elongate member to electrically couple the electrical terminal of the first energy storage component to the electrical terminal of the second energy storage component.

In some implementations, the first energy storage component further includes an electrical terminal disposed on the surface of the first energy storage component adjacent to the elongate member, wherein the second energy storage component further includes an electrical terminal disposed on the surface of the second energy storage component adjacent to the elongated cavity, wherein the elongated cavity is further configured to receive the elongate member to mechanically couple the first energy storage component to the second energy storage component and to electrically couple the electrical terminal of the first energy storage component to the electrical terminal of the second energy storage component.

In some implementations, the elongated cavity is further configured to receive the elongate member to electrically couple the first energy storage component to the second energy storage component in series.

In some implementations, the elongated cavity is further configured to receive the elongate member to electrically couple the first energy storage component to the second energy storage component in parallel.

In some implementations, the first energy storage component has a higher power density than the second energy storage component, wherein the first energy storage component has a lower energy density than the second energy storage component.

In some implementations, the first energy storage component includes a capacitor, wherein the second energy storage component includes a battery.

In some implementations, the first energy storage component has a lower power density than the second energy storage component, wherein the first energy storage component has a higher energy density than the second energy storage component.

In some implementations, the first energy storage component includes a battery, wherein the second energy storage component includes a capacitor.

In some implementations, the first energy storage component has a same power density as the second energy storage component, wherein the first energy storage component has a same energy density as the second energy storage component.

In some implementations, the first energy storage component includes a capacitor and battery, wherein the second energy storage component includes a capacitor and a battery.

The present disclosure further provides an energy management system. The energy management system can store energy received from an energy source and provide energy to an electrical load. The energy management system can include a housing, a first energy storage assembly, a second energy storage assembly, one or more switches, and one or more hardware processors. The first energy storage assembly can removably physically couple within the housing. The first energy storage assembly can removably electrically couple to one or more first terminals disposed within the housing. The second energy storage assembly can removably physically couple within the housing. The second energy storage assembly can removably electrically couple to one or more second terminals disposed within the housing. The one or more switches can transition between a plurality of states. The one or more switches may be in electrical communication with the one or more first terminals. The one or more switches may be in electrical communication with the one or more second terminals. The one or more hardware processors can execute program instructions to cause the one or more switches to electrically couple the one or more first terminals to the one or more second terminals to cause first energy storage assembly to couple to the second energy storage assembly in series to provide energy to an electrical load. The one or more hardware processors can execute program instructions to cause the one or more switches to electrically disconnect the one or more first terminals from the one or more second terminals to receive energy from an energy source.

In some implementations, the one or more hardware processors is further configured to execute the program instructions to: cause the one or more switches to electrically couple the first energy storage assembly to the second energy storage assembly in parallel.

In some implementations, the one or more hardware processors is further configured to execute the program instructions to: generate user interface data for rendering one or more user interfaces including data relating to an operation of the energy management system.

In some implementations, the one or more hardware processors is further configured to execute the program instructions to: generate instructions to a user to physically couple a third energy storage assembly to the housing.

In some implementations, the one or more hardware processors is further configured to execute the program instructions to: generate instructions to a user to physically decouple the first or second energy storage assembly from the housing.

In some implementations, the one or more hardware processors is further configured to execute the program instructions to: electrically couple the one or more first terminals to the one or more second terminals or electrically disconnect the one or more first terminals from the one or more second terminals based on at least a user input.

In some implementations, the one or more hardware processors is further configured to execute the program instructions to: electrically couple the one or more first terminals to the one or more second terminals or electrically disconnect the one or more first terminals from the one or more second terminals based on at least sensor information.

In some implementations, the one or more hardware processors is further configured to execute the program instructions to: electrically couple the one or more first terminals to the one or more second terminals or electrically disconnect the one or more first terminals from the one or more second terminals based on at least a voltage of the energy source.

In some implementations, the one or more hardware processors is further configured to execute the program instructions to: electrically couple the one or more first terminals to the one or more second terminals or electrically disconnect the one or more first terminals from the one or more second terminals based on at least a voltage of the first energy storage assembly.

In some implementations, the one or more hardware processors is further configured to execute the program instructions to: electrically couple the one or more first terminals to the one or more second terminals or electrically disconnect the one or more first terminals from the one or more second terminals based on at least a voltage of the second energy storage assembly.

In some implementations, the one or more hardware processors is further configured to execute the program instructions to: electrically couple the one or more first terminals to the one or more second terminals or electrically disconnect the one or more first terminals from the one or more second terminals based on at least requirements of the electrical load.

In some implementations, the energy management system, further includes a third energy storage assembly in electrical communication with the one or more switches and configured to removably physically couple within the housing; and removably electrically couple to one or more third terminals disposed within the housing, wherein the one or more hardware processors is further configured to execute the program instructions to: cause the one or more switches to electrically couple the one or more first terminals, the one or more second terminals, and one or more third terminals in series.

In some implementations, the energy management system, further includes a third energy storage assembly in electrical communication with the one or more switches and configured to removably physically couple within the housing; and removably electrically couple to one or more third terminals disposed within the housing, wherein the one or more hardware processors is further configured to execute the program instructions to: cause the one or more switches to electrically couple the one or more first terminals to the one or more third terminals in series; and cause the one or more switches to electrically disconnect the one or more second terminals from the one or more first terminals and the one or more third terminals.

In some implementations, the first energy storage assembly has a higher power density than the second energy storage assembly, wherein the first energy storage assembly has a lower energy density than the second energy storage assembly.

In some implementations, the first energy storage assembly includes a capacitor, wherein the second energy storage assembly includes a battery.

In some implementations, the first energy storage assembly has a same power density as the second energy storage assembly, wherein the first energy storage assembly has a same energy density as the second energy storage assembly.

In some implementations, the first energy storage assembly includes a capacitor and battery, wherein the second energy storage assembly includes a capacitor and a battery.

In some implementations, the housing can further comprise a first opening. The first opening can receive the first energy storage assembly. The first placement clot can include one or more guide tracks. The one or more guide tracks can mechanically couple the one or more energy storage assemblies to the housing. The first opening can include one or more first terminals.

The present disclosure further provides an energy management system. The energy management system can store energy received from an energy source. The energy management system can provide energy to an electrical load. The energy management system can comprise one or more hardware processors. The one or more hardware processors can execute programs instructions to access sensor information relating to a plurality of energy storage assemblies. The sensor information can include a voltage of the plurality of energy storage assemblies. The one or more hardware processors can execute programs instructions to access electrical load requirements. The one or more hardware processors can execute programs instructions to access energy source information. The energy source information can include a voltage of one or more energy sources. The one or more hardware processors can execute programs instructions to cause one or more switches to electrically couple one or more first terminals to one or more second terminals to cause first energy storage assembly to couple to the second energy storage assembly in series based on at least the sensor information and the electrical load requirements. The one or more hardware processors can execute programs instructions to cause the one or more switches to electrically disconnect the one or more first terminals from the one or more second terminals based on at least the sensor information and the energy source information.

The present disclosure further provides an energy management system. The energy management system can store energy received from an energy source and provide energy to an electrical load. The energy management system can comprise a housing. The housing can comprise a plurality of openings. The plurality of openings can receive one or more energy storage assemblies. The openings can include one or more guide tracks. The one or more guide tracks can mechanically couple to the one or more energy storage assemblies. The one or more guide tracks can comprise terminals. The terminals can electrically couple to the energy storage assemblies.

The present disclosure further provides an energy management system. The energy management system can include one or more energy storage assemblies, one or more switches, and one or more hardware processors. The one or more energy storage assemblies can receive and store energy from a plurality of energy sources. The one or more switches can transition between a plurality of states. The one or more switches may be in electrical communication with the one or more energy storage assemblies and the plurality of energy sources. The one or more hardware processors can execute program instructions to cause the energy management system to access energy source information. The energy source information can include information associated with the plurality of energy sources. The one or more hardware processors can execute program instructions to access energy source criteria. The energy source criteria can include at least information associated with the one or more storage assemblies. The one or more hardware processors can execute program instructions to determine an optimal state of the plurality of states based on at least analyzing the energy source criteria and the energy source information. The one or more hardware processors can execute program instructions to cause the one or more switches to transition to the optimal state.

In some implementations, the energy management system further includes one or more sensors configured to obtain energy source information.

In some implementations, analyzing the energy source criteria and the energy source information includes comparing a threshold voltage of the energy source criteria to an available voltage associated with the plurality of energy sources.

In some implementations, analyzing the energy source criteria and the energy source information includes comparing an energy cost threshold value of the energy source criteria to a cost of energy value associated with the plurality of energy sources.

In some implementations, analyzing the energy source criteria and the energy source information includes comparing a rate of charge threshold value of the energy source criteria to a rate of charge value associated with the plurality of energy sources.

In some implementations, the one or more hardware processors is further configured to determine the optimal state based on at least a user input.

In some implementations, the one or more hardware processors is further configured to cause the one or more switches to transition to the optimal state by electrically coupling a specific energy source of the plurality of energy sources to the one or more energy storage assemblies.

In some implementations, the one or more hardware processors is further configured to cause the one or more switches to transition to the optimal state by electrically decoupling a specific energy source of the plurality of energy sources from the one or more energy storage assemblies.

In some implementations, transitioning to the optimal state includes maintaining an electrical configuration of the one or more switches.

In some implementations, the energy management system further includes an electrical load, wherein the electrical load is configured to receive energy from the one or more energy sources or the plurality of energy sources, the energy source criteria further includes information associated with the electrical load, and the one or more switches is in electrical communication with the electrical load; and wherein the processor is further configured to cause the one or more switches to transition to the optimal state by electrically coupling a specific energy source of the plurality of energy sources to the electrical load.

Various combinations of the above and below recited features, embodiments, implementations, and aspects are also disclosed and contemplated by the present disclosure.

Additional implementations of the disclosure are described below in reference to the appended claims, which may serve as an additional summary of the disclosure.

In various implementations, systems and/or computer systems are disclosed that comprise a computer-readable storage medium having program instructions embodied therewith, and one or more processors configured to execute the program instructions to cause the systems and/or computer systems to perform operations comprising one or more aspects of the above- and/or below-described implementations (including one or more aspects of the appended claims).

In various implementations, computer-implemented methods are disclosed in which, by one or more processors executing program instructions, one or more aspects of the above- and/or below-described implementations (including one or more aspects of the appended claims) are implemented and/or performed.

In various implementations, computer program products comprising a computer-readable storage medium are disclosed, wherein the computer-readable storage medium has program instructions embodied therewith, the program instructions executable by one or more processors to cause the one or more processors to perform operations comprising one or more aspects of the above- and/or below-described implementations (including one or more aspects of the appended claims).

BRIEF DESCRIPTION OF THE DRAWINGS

FIGS. 4A-4C illustrate example energy storage components.

DETAILED DESCRIPTION

Overview

A plurality of energy storage components may be coupled in an energy storage assembly without the use of wires, cables, or the like. Advantageously, reducing or eliminating the use of wires or cables may reduce and/or eliminate the amount of energy (e.g., transient energy) contained in wires or cables which may improve the efficiency of an energy storage assembly by maximizing the amount of energy stored in the energy storage components. Further, reducing and/or eliminating the use of wires is also beneficial as wires can be cumbersome, occupy space, and can be highly susceptible to developing defects, fraying, breaking, or eroding over time which can result in energy loss or system failure. Moreover, reducing and/or eliminating the use of wires may also eliminate the need for extra space to accommodate the wires in a system. Moreover, reducing and/or eliminating the use of wires may simplify use of a system by reducing or eliminating knowledge required to operate the system. For example, a user may not be required to know how to electrically connect wires but may only need to "snap" energy storage components together to form a mechanical connection which may also form an electrical connection. Moreover, reducing and/or eliminating the use of wires may prevent accidental electrical connections from forming, such as by wires or cables moving around and coming in contact with undesired surfaces, which may be hazardous and result in unwanted discharges of energy.

Various example implementations are discussed and/or shown herein. The present disclosure is not intended to be limited by any of the provided examples. Any of the example implementations may include structural and/or operational features of any of the other example implementations. For example, any of the energy storage assemblies may include structural and/or operational features of any of the other energy storage assemblies shown and/or discussed. As another example, any of the energy management systems may include structural and/or operational features of any of the other energy management systems shown and/or discussed.

Example Implementations

Figure 1A:
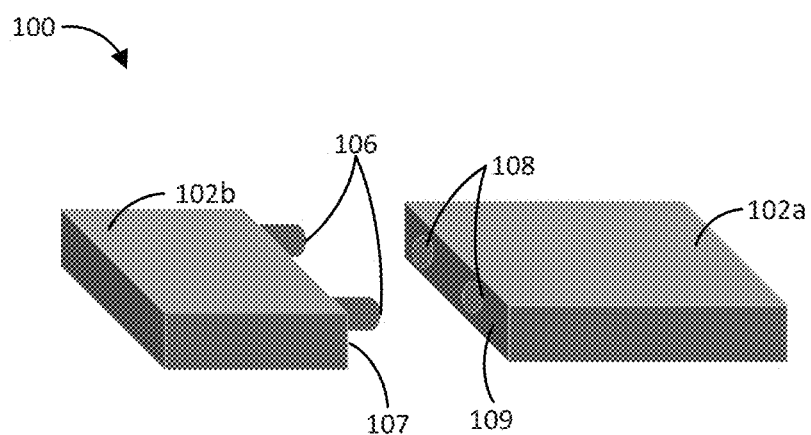
FIGS. 1A-1B are perspective views of example energy storage assemblies.

FIG. 1A is a perspective view of an example implementation of an energy storage assembly 100. The energy storage assembly 100 can include one or more energy storage components 102 such as energy storage components 102a, 102b. Energy storage assembly 100 may include one energy storage component 102. Energy storage assembly 100 may include two energy storage components 102. Energy storage assembly 100 may include more than two energy storage components 102. The energy storage assembly 100 can include one or more capacitors, such as ultracapacitors, supercapacitors, or the like. The energy storage assembly 100 can include one or more batteries.

Each of energy storage components 102a, 102b may include capacitors and/or batteries. Energy storage component 102a may be a different type than energy storage component 102b. For example, energy storage component 102a may comprise a capacitor and energy storage component 102b may comprise a battery, or vice versa. In some implementations, energy storage component 102a may comprise a same energy storage device as energy storage component 102b.

Energy storage component 102a may have a different energy density than energy storage component 102b. For example, energy storage component 102a be able to store a greater voltage per unit volume than energy storage component 102b, or vice versa. Energy storage component 102a may have a different power density than energy storage component 102b. For example, energy storage component 102a be able to charge and/or discharger at a faster rate than energy storage component 102b, or vice versa.

The energy storage assembly can include a plurality of terminals. The energy storage component 102b can include one or more terminals 106. The terminals 106 may be positioned on a side of the energy storage component 102b. The terminals 106 may be positioned on surface 107 of the energy storage component 102b. The terminals 106 may protrude from the surface 107 of the energy storage component 102b. Terminals 106 can be configured to establish a connection (e.g., mechanical and/or electrical) between the energy storage component 102b and the energy storage component 102a.

The energy storage component 102a can have one or more terminals 108. The terminals 108 can be positioned on surface 109 of energy storage component 102a. The terminals 108 can be configured to receive terminals 106. Terminals 106 and terminals 108 can each include at least one positive and one negative terminal. The terminals 106 can include at least one positive and one negative terminal. The energy storage component 102b can establish an electrical connection with the energy storage component 102a when terminals 106 contact the terminals 108 (e.g., are received into the terminals 108). In some implementations, terminals 106 and the terminals 108 are electrically connected positive to negative. In other implementations, the terminals are electrically connected positive to positive and negative to negative. In some implementations, the energy storage component 102b is electrically connected in series with the energy storage component 102a. In some implementations, the energy storage component 102b is electrically connected in parallel with the energy storage component 102a.

In this example implementation, terminals 106 are cylindrical in shape and extend a length away from a surface 107 of the energy storage component 102b. As shown, terminals 106 can protrude outward from the energy storage component 102b. The terminals 108 are cylindrical in shape and extend a length within an interior region of the energy storage component 102a. As shown, the terminals 108 form cavities, or recesses, or openings, from surface 109 to an interior region of the energy storage component 102a.

The terminals 108 can have a diameter that is the same as, or substantially similar to, the diameter of terminals 106. The length of the terminals 108 can be substantially the same as the length of terminals 106. In some implementations, the diameter and/or length of the terminals 108 may be slightly different (e.g., larger or smaller) than the diameter and/or length of terminals 106 which may facilitate a proper fit between terminals 106 and terminals 108. These sizes may also be adjusted to accommodate thermal expansion of the energy storage component 102a and/or energy storage component 102b. In some implementations, terminals 106 may have a uniform radius along a length of the terminals. In some implementations, terminals 106 may have a variable radius along a length of the terminals which may facilitate a force-fit connection.

Terminals 106 may vary in shape and/or size. In some implementations, the cross-section of terminals 106 may be circular, square, rectangular, triangular, or resemble any orthogonal shape. In some implementations, the terminals 108 may correspond to (e.g., mirror) any of these shapes to ensure contact in-whole or in-part with terminals 106. In some implementations, a size and/or shape of each of the terminals 106 may be different and a size and/or shape of each of the terminals 108 may be different. Accordingly, only one of the terminals 108 may be sized and/or shaped to receive only one of terminals 106 which may advantageously prevent electrical and/or mechanical connection between terminals 106 and terminals 108 that should not be connected. For example, a first terminal of terminals 106 may include a circular cross section and a first terminal of the terminals 108 may include a circular cross section while a second terminal of terminals 106 may include a rectangular cross section and a second terminal of the terminals 108 may include a rectangular cross such that the first terminal of terminals 106 can connect with only the first terminal of the terminals 108 and the second terminal of terminals 106 can connect with only the second terminal of the terminals 108.

In the depicted implementation, the energy storage component 102b is positioned next to the energy storage component 102a so that terminals 106 are in-line with the terminals 108. A force can be applied to energy storage component 102b to insert terminals 106 into the terminals 108 to form an electrical and/or mechanical connection between energy storage component 102b and energy storage component 102a. The mechanical connection may be a press-fit, snap-fit, force-fit, friction-fit, clip connection, or snap contact connection. In some implementations, a diameter or width of the terminals 108 (or portion thereof) may be smaller than the diameter or width of terminals 106 (or portion thereof). Accordingly, a terminal 106 having a diameter or width of approximately equal to the diameter or width of the terminals 108 (or slightly greater than the diameter of the terminals 108) may be snapped into the terminals 108 by pressing terminals 106 against the entrance to the terminals 108 to slightly flex terminals 106 and/or terminals 106 so that terminals 106 enter the terminals 106. Once terminals 106 are within the terminals 108, terminals 106 may be held in place. When terminals 106 are within the terminals 108, terminals 106 may exert an outward force (e.g., radial force) on an inside surface of the terminals 108 which may facilitate holding terminals 106 within the terminals 108.

Surface 107 may contact surface 109 when energy storage component 102b is mechanically and/or electrically coupled with energy storage component 102a. A gap may not exist between surface 107 and surface 109 when energy storage component 102b is mechanically and/or electrically coupled with energy storage component 102a. An entire area of surface 107 may contact surface 109 when energy storage component 102b is mechanically and/or electrically coupled with energy storage component 102a. Advantageously, the energy storage assembly 100 may improve space requirements at least because surface 107 directly contacts surface 109 when energy storage component 102b is mechanically and/or electrically coupled with energy storage component 102a. The volume of energy storage assembly may be reduced because there is minimal or no space in between energy storage component 102b and energy storage component 102a when they are mechanically and/or electrically coupled together.

In some implementations, the energy storage component 102b and/or energy storage component 102a may include one or more magnets. The magnets may facilitate a mechanical and/or electrical connection between the energy storage component 102b and energy storage component 102a. In some implementations, magnets may be placed on and/or within terminals 106 and terminals 108. In some implementations, magnets may be placed on and/or within the energy storage component 102b. The magnets may be positioned on surface 107. The magnets may be positioned on surface 109.

In some implementations, the energy storage assembly 100 can include one or more diodes. Energy storage component 102a and/or energy storage component 102b can include one or more diodes. One or diodes may be positioned within one or more of terminals 106 and/or the terminals 108. The diode(s) may control a flow of energy between the energy storage component 102b and the energy storage component 102a. For example, the diode(s) may be biased toward the energy storage component 102a such that energy (e.g., electrical current) flows from the energy storage component 102b to the energy storage component 120a and is prevented from flowing from the energy storage component 102a to the energy storage component 102b.

In some implementations, the energy storage assembly 100 can include one or more electrical switches. Energy storage component 102a and/or energy storage component 102b can include one or more switches. One or switches may be positioned within one or more of terminals 106 and/or the terminals 108. The switch(es) may control a flow of energy between the energy storage component 102b and the energy storage component 102a. The switch(es) may exist in an open state wherein the switch allows energy (e.g., electrical current) to flow from the energy storage component 102b to the energy storage component 102a. The switch(es) may exist in a closed wherein the switch prevents energy (e.g., electrical current) from flowing from the energy storage component 102b to the energy storage component 102a. For example, in the closed state, terminals 106 may be mechanically connected with the batter terminals 108, but not electrically connected with the terminals 108, such that energy does not flow between the terminals 106 and the terminals 108.

In some implementations, the energy storage component 102b may include a single ultracapacitor. In other implementations, the energy storage component 102b may include a plurality of ultracapacitors that are connected together (e.g., electrically connected in series and/or parallel) such as within a single casing or housing. In some implementations, the energy storage component 102a may be a single battery. In other implementations, the energy storage component 102a may be a plurality of batteries connected together (e.g., electrically connected in series and/or parallel) within a single casing.

The terminals 106 and the terminals 108 may include material(s) that effectuate an electrical connection (e.g., the flow of electrons). Such materials may include electrically conductive materials such as metal(s) (e.g. lead, copper, or the like) or metal alloy(s).

In some implementations, multiple energy storage components 102b may be connected to a single energy storage component 102a. For example, a first energy storage components 102b may be connected to a surface of the energy storage component 102a, and a second energy storage component 102b may be connected to another surface of the energy storage component 102a. In some implementations, a plurality of energy storage components 102b may be connected to the same surface of the energy storage component 102a.

When coupled together (e.g., electrically), the energy storage component 102b may be in electrical communication with the energy storage component 102a via the terminals 106, 108. This electrical connection can allow for the transfer of energy between the energy storage component 102b and the energy storage component 102a. For example, energy stored in the energy storage component 102b may flow (e.g., in the form of an electrical current) from the energy storage component 102b through terminals 106, through the terminals 108, and into the energy storage component 102a to be stored as an energy of the energy storage component 102a. Energy that is stored in the energy storage component 102a may be used to power a device, machine, or apparatus that is electrically connected to the energy storage component 102a. In some implementations, as the energy of the energy storage component 102a is depleted (e.g., provided to a load), energy can be transferred into the energy storage component 102a from the energy storage component 102b via the terminals 106, 108. The transfer of energy from the energy storage component 102b to the energy storage component 102a may stabilize the voltage levels of the energy storage component 102a, for example, by preventing the energy storage component 102a from dropping below a threshold energy level. In some implementations, the energy storage component 102b charges the energy storage component 102a.

Energy storage component 102a may be a same size and/or shape as energy storage component 102b. Energy storage component 102a may be a different size and/or shape as energy storage component 102b. Energy storage components 102 can be cuboidal. Energy storage components 102 can be cylindrical.

Figure 1B:
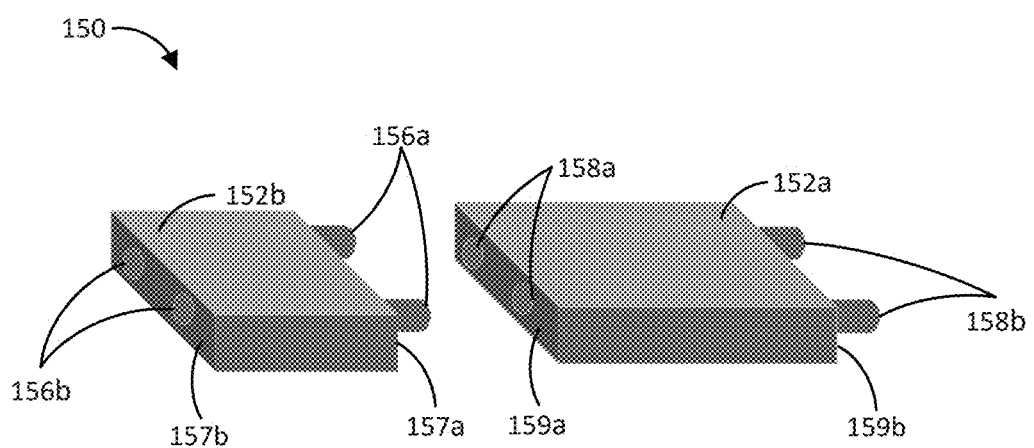

FIG. 1B is a perspective view of an example implementation of an energy storage assembly 150. The energy storage assembly 150 can include similar structural and/or operational features as energy storage assembly 100 shown and/or discussed with reference to FIG. 1A. The energy storage assembly 150 can include one or more energy storage components 152, such as energy storage components 152a, 152b. The energy storage component 152a can include similar structural and/or operational features as energy storage component 152a shown and/or discussed with reference to FIG. 1A. The energy storage component 152b can include similar structural and/or operational features as energy storage component 152b shown and/or discussed with reference to FIG. 1A.

Energy storage component 152b can include a plurality of terminals such as terminals 156a and terminals 156b. Terminals 156a can extend away from surface 157a of energy storage component 152b. Terminals 156a can protrude outward from energy storage component 152b. Terminals 156b can extend away from surface 157b. Terminals 156b can protrude inward to energy storage component 152b. Terminals 156b can include apertures within surface 157b.

Energy storage component 152a can include a plurality of terminals such as terminals 158a and terminals 158b. Terminals 158a can extend away from surface 159a of energy storage component 152a. Terminals 158a can protrude inward to energy storage component 152a. Terminals 158a can include apertures within surface 159a. Terminals 158b can extend away from surface 159b. Terminals 158b can protrude outward from energy storage component 152a.

Energy storage assembly 150 can include a plurality of energy storage components. For example, energy storage component 152b may mechanically and/or electrically couple to another energy storage component via terminals 156b. As another example, energy storage component 152a may mechanically and/or electrically couple to another energy storage component via terminals 158b. In some implementations, the energy storage assembly 150 can include three, four, or five energy storage components. In some implementations, the energy storage assembly 150 can include more than five energy storage components.

The terminals 156a may be disposed on a surface of energy storage component 152b that is different from a surface on which the terminals 156b are disposed. For example, terminals 156a may be positioned on surface 157a which may be a different surface than surface 157b on which terminals 156b may be positioned. As another example, terminals 156a may be positioned on surface 157a which may be on an opposite side of energy storage component 152b as surface 157b on which terminals 156b may be positioned. Surface 157a may be parallel to surface 157b. Surface 157a may be non-parallel to surface 157b. Surface 157a may be orthogonal to surface 157b.

Advantageously, in some implementations, where energy storage components include terminals positioned on opposite sides of the energy storage component, which may be shown and/or described with reference to FIG. 1B, consecutive energy storage components may be arranged end to end in the energy storage assembly 150. Energy storage assembly 150 may be symmetrical across one or more axes such as when consecutive energy storage components are coupled together in parallel or series.

Figure 2:
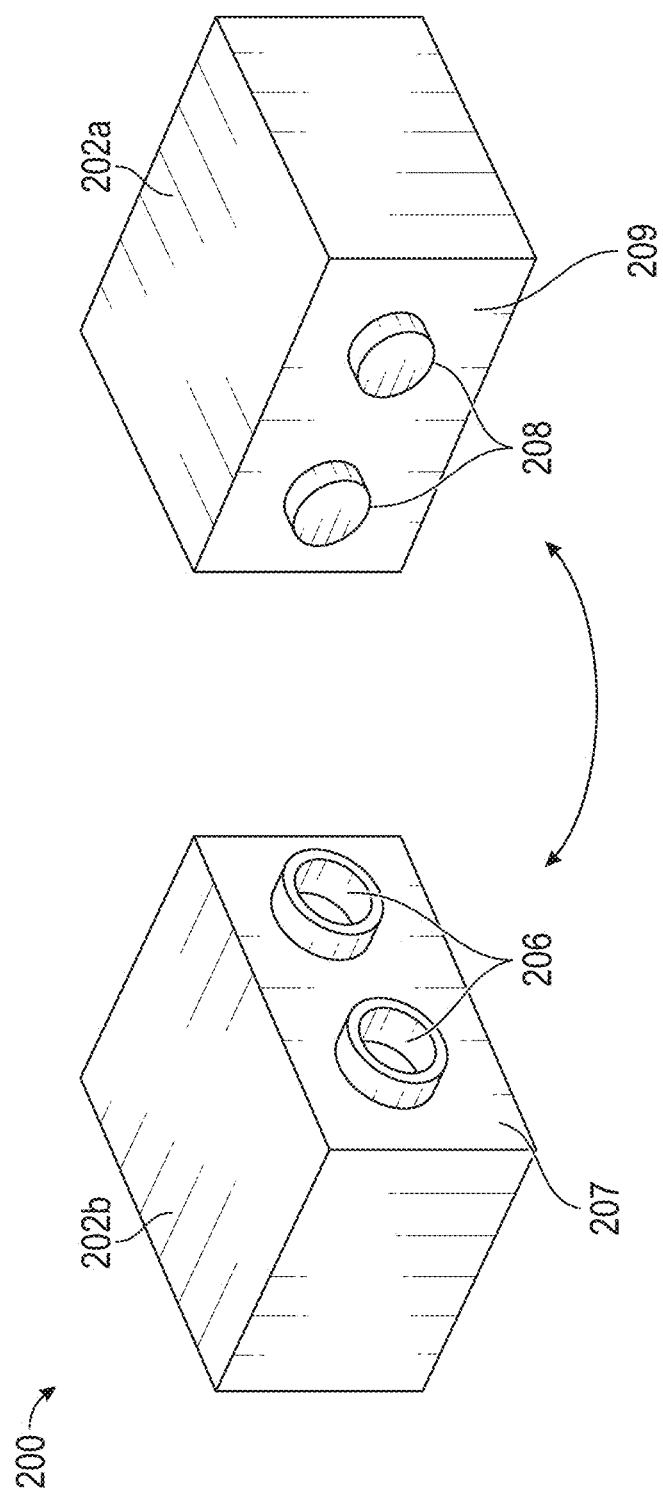
FIG. 2 is a perspective view of an energy storage assembly according to an example implementation.

FIG. 2 is a perspective view of an example implementation of an energy storage assembly 200. The energy storage assembly 200 can include similar structural and/or operational features as energy storage assembly 100 shown and/or discussed with reference to FIG. 1A. The energy storage assembly 200 can include one or more energy storage components 202, such as energy storage components 202a, 202b. The energy storage component 202a can include similar structural and/or operational features as energy storage component 102a shown and/or discussed with reference to FIG. 1A. The energy storage component 202b can include similar structural and/or operational features as energy storage component 102b shown and/or discussed with reference to FIG. 1A. Energy storage component 202b can include terminals 206. Energy storage component 202a can include terminals 208. Terminals 206 may extend away from surface 207. Terminals 206 may protrude from energy storage component 202b. Terminals 206 can include an interior region. The interior region of terminals 206 may be a similar size and/or shape as terminals 208. Terminals 206 can receive terminals 208 such as within an interior region of terminals 206. Terminals 206 may cover terminals 208. Terminals 206 may cover entire surface area of terminals 208.

Terminals 206 may contact surface 209 when energy storage component 202b is mechanically and/or electrically coupled to energy storage component 202a. Terminals 206 may inhibit surface 207 from contacting surface 209 when energy storage component 202b is mechanically and/or electrically coupled to energy storage component 202a. Surface 207 may be separated from surface 209 by a distance similar to a length of terminals 206 when energy storage component 202b is mechanically and/or electrically coupled to energy storage component 202a.

The terminals 206 can include electrically conductive material which may contact the terminals 208. The terminals 206 can include electrically insulative material such as plastic, rubber, glass, ceramic, acrylic, etc. The electrically insulative material may be disposed on an exterior region of the terminals 206. The electrically insulative material of terminals 206 may cover electrically conductive portions of terminals 206 and/or terminals 208. The electrically insulative material of terminals 206 may inhibit undesired electrical connections between terminals 206 and/or 208 and other devices, systems, apparatuses, etc. This can mitigate unwanted electrical discharge, prevent energy loss, and make the energy storage assembly 200 safer to use.

Figure 3A:
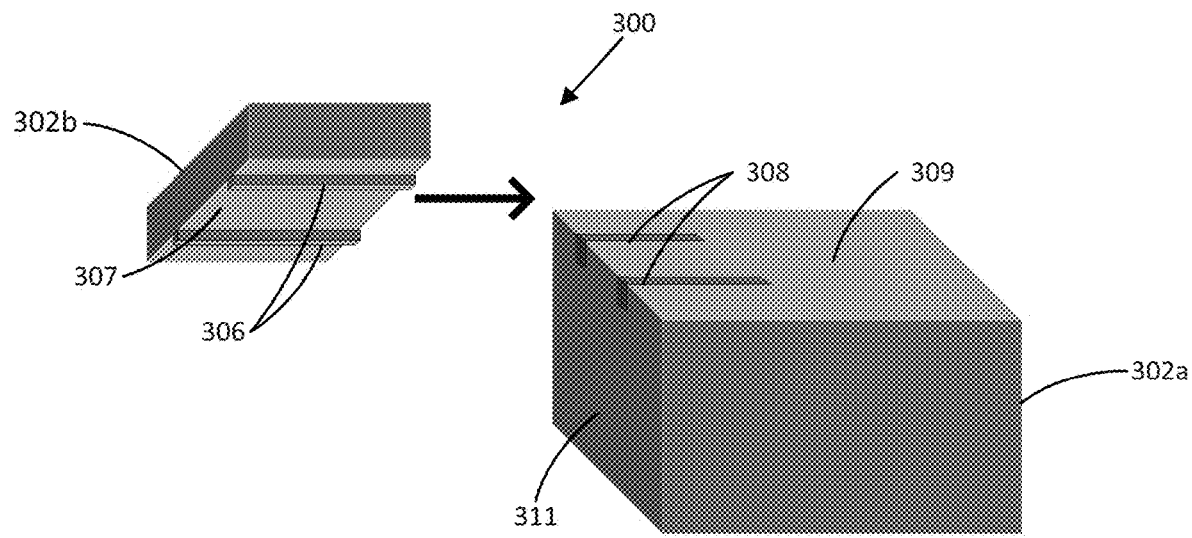
FIG. 3A is a perspective view of an example energy storage assembly including terminals according to an example implementation.

FIG. 3A is a perspective view of an example implementation of an energy storage assembly 300. The energy storage assembly 300 can include similar structural and/or operational features as any of the other example energy storage assemblies shown and/or discussed herein. The energy storage assembly 300 can include one or more energy storage components 302, such as energy storage components 302a, 302b. The energy storage components 302 can include similar structural and/or operational features as any of the other example energy storage components shown and/or discussed herein. Energy storage component 302b can include terminals 306. Energy storage component 302a can include terminals 308.

The terminals 306 may extend from a surface 307 of the energy storage component 302b. The terminals 306 can be elongate. The terminals 306 can be cuboidal. The terminals 306 can be rectangular. The terminals 306 can extend across a length of the surface 307 of the energy storage component 302b. In some implementations, the terminals 306 may extend across an entire length of the surface 307 of the energy storage component 302b. In some implementations, the terminals 306 may extend across a portion of the surface 307 of the energy storage component 302b. The terminals 306 can be spaced apart from each other.

The terminals 308 can be positioned on the energy storage component 302a. The terminals 308 can receive the terminals 306. The terminals 308 can extend inward to the energy storage component 302a from a surface 309. The terminals 308 can form an aperture on surface 309. The terminals 308 can form an aperture on more than one surface, such as on surface 309 and surface 311. The terminals 308 can receive the terminals 306. The terminals 308 can extend across a length of the surface 309 of the energy storage component 302a. In some implementations, the terminals 308 may extend across an entire length of the surface 309 of the energy storage component 302a. In some implementations, the terminals 308 may extend across a portion of the surface 309 of the energy storage component 302a. The terminals 308 can be spaced apart from each other.

To connect the energy storage component 302b to the energy storage component 302a (e.g., electrically and/or mechanically), the energy storage component 302b can be positioned adjacent to the side of the energy storage component 302a such that the terminals 306 align with the terminals 308. As shown in FIG. 3A, an end of the energy storage component 302b is positioned facing the another surface of the energy storage component 302a. A force can be applied to the energy storage component 302b to induce the terminals 306 to enter the terminals 308. The connection may be secured by a lock or switch that prevents the terminals 306 from sliding out of the terminals 308. This lock may be positioned on the energy storage component 302a and latch the energy storage component 302b in place after the electrical connection has been formed. In some implementations, the connection between the terminals 306 and terminals 308 may be magnetic. Magnets may be placed on either the energy storage component 302b, energy storage component 302a, or any of the terminals. In some implementations, the connection between the terminals 306 and terminals 308 may be a friction or interference fit.

Surface 307 may contact surface 309 when energy storage component 302b is mechanically and/or electrically coupled with energy storage component 302a. A gap may not exist between surface 307 and surface 309 when energy storage component 302b is mechanically and/or electrically coupled with energy storage component 302a. An entire area of surface 307 may contact surface 309 when energy storage component 302b is mechanically and/or electrically coupled with energy storage component 302a. Advantageously, the energy storage assembly 300 may improve space requirements at least because surface 307 directly contacts surface 309 when energy storage component 302b is mechanically and/or electrically coupled with energy storage component 302a. The volume of energy storage assembly may be reduced because there is minimal or no space in between energy storage component 302b and energy storage component 302a when they are mechanically and/or electrically coupled together.

Figure 3B:
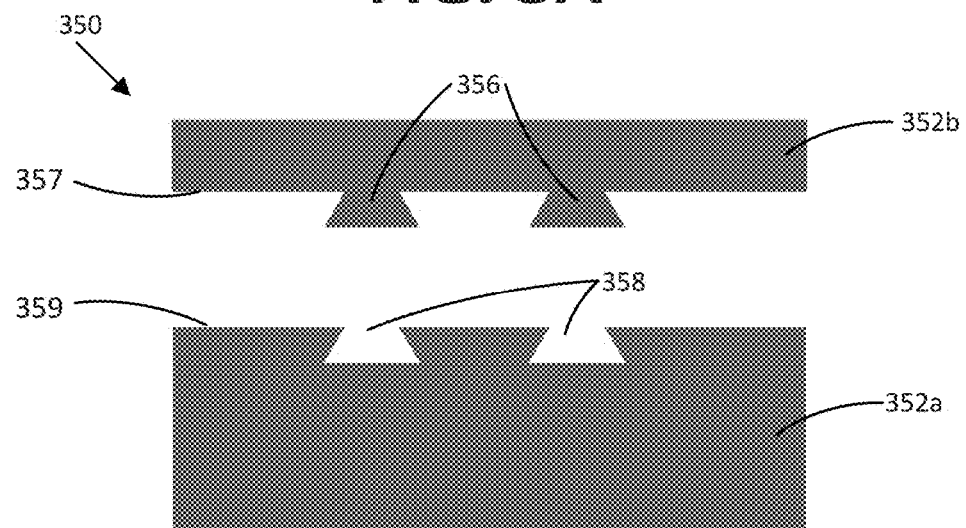
FIG. 3B is a side view of an example energy storage assembly including terminals according to an example implementation.

FIG. 3B is a sideview of an example energy storage assembly 350. The energy storage assembly 350 can include similar structural and/or operational features as energy storage assembly 300 shown and/or discussed herein.

The terminals 356 may be trapezoidal. For example, a cross-section of the terminals 356 resemble a trapezoid. The terminals 356 may be asymmetrical across one or more axes. For example, the terminals 356 may include a narrower section and a wider section. The terminals 356 may be symmetrical across one or more axes. The terminals 358 may mirror the cross-sectional shape of the terminals 356. The terminals 358 may receive terminals 356. The terminals 358 may extend along an entire length of surface 359 of energy storage component 352a. The shape of the terminals 356 and the terminals 358 may facilitate movement of energy storage component 352b in one direction with respect to energy storage component 352a and inhibit movement of energy storage component 352b in another direction with respect to energy storage component 352a. For example, when terminals 356 are received in terminals 358, friction between terminals 356 and 358 may inhibit the energy storage component 352b from moving vertically from energy storage component 352a which may inhibit electrical disconnection between energy storage component 352a and energy storage component 352b.

FIG. 4A illustrates an example energy storage component 402. The energy storage component 402 can include similar structural and/or operational features as any of the other example energy storage components shown and/or described herein. The energy storage component 402 can include a housing 404, terminals 406, and one or more energy devices 405 (e.g., 405a, 405b, 405c). The energy devices 405 may be capacitors, such as ultracapacitors. The energy storage component 402 can include one, two, three, or more than three energy devices 405. The energy devices 405 can be positioned within the housing 404. The energy devices 405 can be adjacent to one another. The energy devices 405 can be positioned horizontally within the housing 404, such as shown. In some implementations, the energy devices 405 may by positioned vertically within the housing 404. In some implementations, the energy devices 405 can be positioned horizontally and vertically with respect to one another within the housing. For example, the energy devices 405 may be stacked in multiple rows on top of one another within the housing 404.

The housing 404 may cover an entirety of one or more of the energy devices 405. For example, the energy devices 405 may not be visible from an exterior of the housing 404. In some implementations, the housing 404 may cover less an entirety of one or more of the energy devices. For example, one or more energy devices 405 may be exposed to an exterior of the housing 404. In some implementations, the housing 404 may include multiple disparate components that couple together around the energy devices 405. Advantageously, the housing 404 may be assembled or disassembled to access the one or more energy devices 405 such as to replace the energy devices 405. In some implementations, the housing 404 may form a single, unitary structure.

The housing 404 may cuboidal. In some implementations, the shape of the housing 404 may match the arrangement the energy devices 405 located within the housing such that the housing may take the shape of any orthogonal polygon. The housing 404 may be made of a rigid material, such as metal, alloy, plastic, carbon fiber, rubber, or polymer. In some implementations, the housing may be made of a ductile material such as soft rubber or silicon. The housing 404 may include electrically insulative material that can electrically the energy devices 405 from one another and/or from an exterior of the housing.

The energy storage component 402 may mechanically and/or electrically couple to one or more other energy storage components, such as via terminals 406, such as shown and/or described herein.

FIGS. 4B-4C illustrate top cross section views of energy storage component 402. Each energy device 405 can have a positive terminal and a negative terminal. The negative terminals of the energy devices 405 can electrically connect to terminal 406a. The positive terminals of the energy devices 405 can electrically connect to terminal 406b. The energy devices 405 can electrically connect to terminals 406 via one or more electrically conductive material such as copper, lead, metal, metal alloy, etc. The electrically conductive material can include one or more wires. The electrically conductive material can include one or more materials embedded or inlaid within the housing 404. In some implementations, the energy devices 405 can be electrically connected to the terminals 406 via a circuit board. The energy devices 405 may connect to the terminals 406 in series such as may be shown in FIG. 4B. The energy devices 405 may connect to the terminals 406 in parallel such as may be shown in FIG. 4C.

Figure 5:
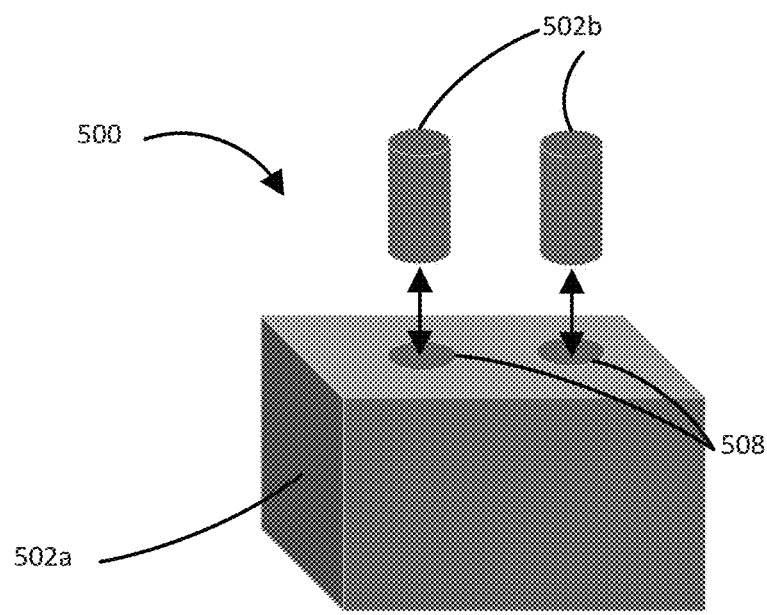
FIG. 5 is a perspective view of an energy storage assembly according to an example implementation.

FIG. 5 illustrates another example energy storage assembly 500. The energy storage assembly 500 can include energy storage component 502a, and energy storage components 502b. Energy storage component 502a can include one or more terminals 508. The terminals 508 can be cylindrical. The energy storage components 502b can be cylindrical. The terminals 508 can be disposed on a surface of energy storage component 502a. The terminals 508 can receive energy storage components 502b.

In some implementations, the energy storage components 502b may be fully inserted, for example such that a surface of the energy storage component 502b is flush with a surface of the energy storage component 502a. The energy storage component 502a may cover the energy storage components 502b. The energy storage component 502a may surround the energy storage components 502b. In some implementations, the energy storage components 502b may be partially inserted in the terminals 508 such that a portion of the energy storage components 502b protrudes from the energy storage component 502a. The volume of the terminals 508 can be substantially similar to a volume of the energy storage components 502b.

The energy storage components 502b can include handles to facilitate removing the energy storage components 502b from the terminals 508.

In some implementations, the energy storage components 502b can mechanically couple to the energy storage component 502a to inhibit the energy storage components 502b from moving relative to the energy storage component 502a. In some implementations, the energy storage components 502b can mechanically couple to the energy storage component 502a via one or more of a magnetic force, adhesions, friction, etc. In some implementations, the energy storage component 502a may include a latch on a surface such that when the energy storage components 502b are inserted into the terminals 508, the latch slides over and/or clips the energy storage components 502b to secure them in place.

A cross section of the terminals 508 may be asymmetrical. A cross section of the energy storage components 502b may be asymmetrical. The terminals 508 can be prismatic. The energy storage components 502b can be prismatic. A size and/or shape of the terminals 508 and/or energy storage components 502b may prevent the energy storage components 502b from rotating relative to the terminals 508.

In some implementations, the terminals 508 may include a gripping mechanism on the inside surface of the cavity that is activated from a downward force from the energy storage components 502b being inserted. This gripping mechanism may function to mechanically reduce the size of the terminals 508 so as to increase frictional forces exerted on the energy storage components 502b. In some implementations, this gripping mechanism may include a spring-loaded cam and plunger mechanism within the terminal 508. This gripping mechanism may be deactivated by an additional downward force exerted on the energy storage components 502b. In some implementations, the energy storage components 502b may be inserted into the terminals 508 and twisted to activate a locking mechanism between the energy storage components 502b and the energy storage components 502a. In some implementations, the locking mechanism may include a partial flange located on the energy storage components 502b that extends radially away from a surface of the energy storage components 502b. The terminal 508 may include a slot that extends vertically and along the circumference of the cavity. When the energy storage components 502b is inserted into the terminal 508, the partial flange enters the slot, and as the energy storage components 502b is twisted, the partial flange proceeds to slide along the slot to a locked position as the energy storage components 502b may not be removed vertically without further circumferential rotation. In some implementations, the energy storage components 502a may include a cover that may be placed over the terminals 508 such as after the energy storage components 502b have been inserted into the terminals 508, thus securing the energy storage components 502b in place and preventing them from falling out of the terminals 508.

In some implementations, the energy storage components 502b may screw into the terminals 508.

Figure 6:
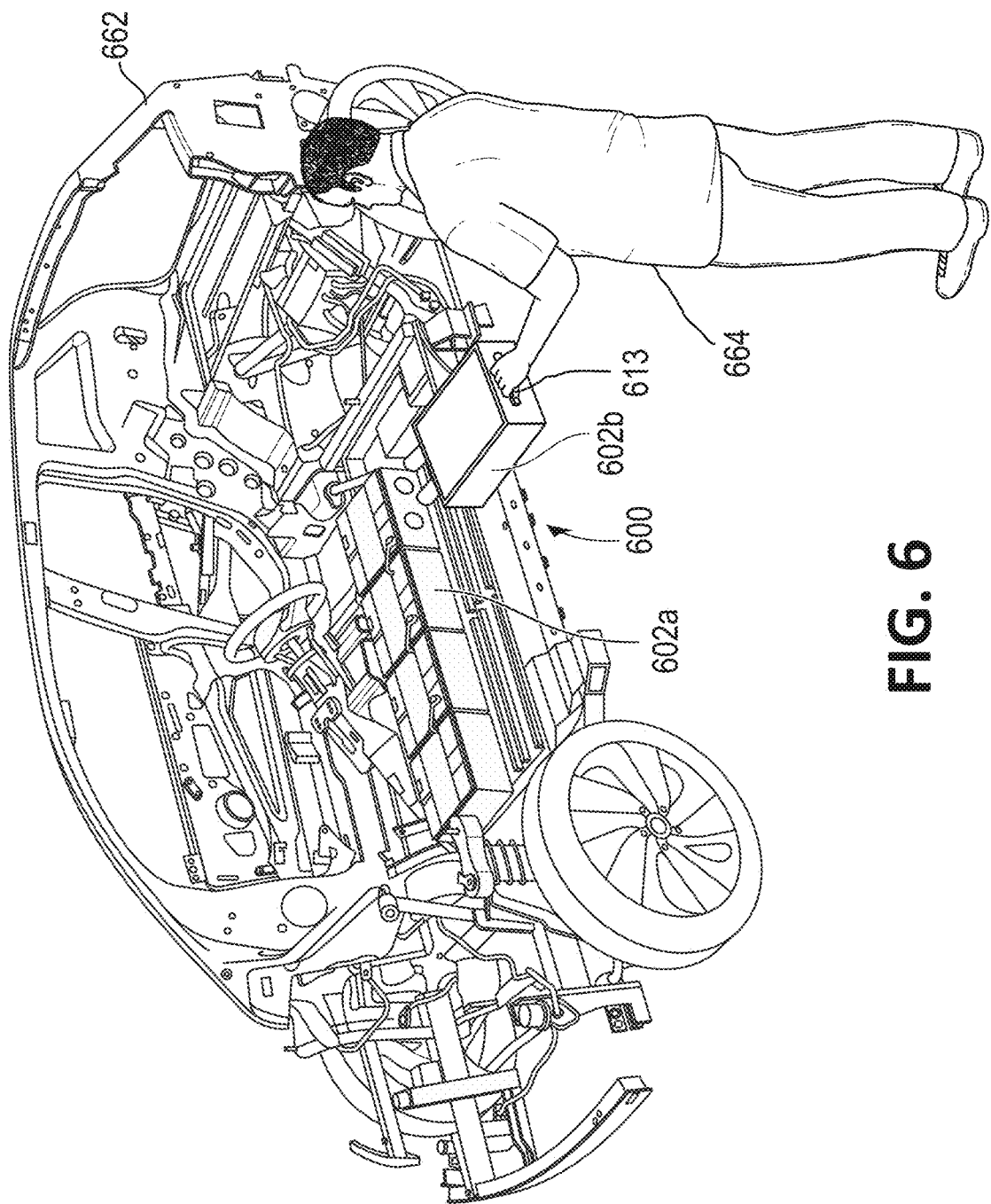
FIG. 6 is an example implementation of an energy storage assembly in a vehicle.

FIG. 6 is an example implementation of an energy storage assembly 600 in a vehicle 662. The energy storage assembly 600 can include similar structural and/or operational features as any of the other example energy storage assemblies shown and/or discussed herein. The energy storage assembly 600 may include an energy storage component 602a and energy storage component 602b. Energy storage component 602a can include one more energy storage components. The energy storage component 602a can be positioned within a housing of the vehicle 662. The energy storage component 602a may form a battery field or battery array. The energy storage assembly 600 may provide energy to the vehicle 662 to power the vehicle 662. The energy storage assembly 600 may provide energy to a traction motor of the vehicle 662 to provide locomotive power to the vehicle.

The energy storage component 602b can include a handle 613. A user 664 may hold energy storage component 602b by the handle 613 which can facilitate easy transportation of the energy storage component 602b by the user 664. The user 664 can position energy storage component 602b within the vehicle. The user 664 can remove energy storage component 602b from the vehicle. The user 664 can mechanically and/or electrically couple energy storage component 602b to energy storage component 602a. The user 664 can mechanically and/or electrically decouple energy storage component 602b to energy storage component 602a. The user 664 may add or remove energy storage components from the energy storage assembly 600. The energy storage component 602b may mechanically and/or electrically couple to energy storage component 602a via terminals positioned on the energy storage components 602a and/or energy storage component 602b.

According to this implementation, the energy storage component 602b may fit into a channel of the vehicle 662 that can guide energy storage component 602b to connect with energy storage component 602a. The user 664 may access the energy storage component 602a from outside the vehicle 662 such as while standing beside the vehicle 662. The user 664 may couple or decouple energy storage component 602b from energy storage component 602a with exterior to the vehicle 662, as shown. In some implementations, the user 664 may access the energy storage components 602a from an interior region of the vehicle 662 such as when sitting within a seat of the vehicle. The user 664 may couple or decouple energy storage component 602b with energy storage component 602a from an interior region of the vehicle 662.

In some implementations, a user 664 may instruct the energy storage assembly 600 to mechanically and/or electrically disconnect the energy storage component 602b before removing it from the vehicle 662. The user 664 may communicate instructions to the energy storage assembly 600 through user input into the vehicle 662, such as via a button, latch, screen, display, located on an exterior region of the vehicle or an interior region of the vehicle such as on the dashboard of the vehicle. The user 664 may communicate instructions to the energy storage assembly 600 wirelessly from a user device such as a mobile device, a tablet, phone, or computer via wifi, satellite, or Bluetooth. Upon receiving the commands, the energy storage assembly 600 may release or unlock the energy storage component 602b by an internal actuator. In other implementations, the user 664 may manually unlock or disconnect the energy storage component 602b.

According to one example implementation, a user 664 may remove the energy storage component 602b from the vehicle 662 (e.g., mechanically and/or electrically disconnecting the energy storage component 602b from the energy storage component 602a) when the energy storage component 602b is low on charge. The user 664 may then insert a fully charged energy storage component 602b into the vehicle 662 to mechanically and/or electrically connect to the energy storage component 602a. Advantageously, the ability to quickly replace energy storage components of an energy storage assembly within a vehicle 662 may reduce and/or eliminate the need for lengthy charge times because a new energy storage component 602 can be inserted whenever the energy of the energy storage assembly 600 is low. The user 664 can remove one or more energy storage components of the energy storage assembly 600 at a single time. The user 664 can add one or more energy storage components of the energy storage assembly 600 at a single time.

The energy storage component 602a is positioned centrally along the length of the vehicle 662. The energy storage component 602a can include one or more input terminals for the energy storage component 602b to connect to. In some implementations, the energy storage component 602a may include multiple sets of input terminals to accommodate multiple additional energy storage components. The energy storage component 602a may be positioned closer to a side of the vehicle 662 to allow for easier access.

The energy storage assembly 600 can include a hardware processor capable of executing program instructions to cause the energy storage assembly 600 to perform one or more actions. The energy storage assembly 600 may include one or more sensors (e.g., voltage sensor, current sensor) that monitors the charge of the energy storage assembly 600 and energy storage components thereof. The hardware processor can determine an estimated mileage or time duration until the charge drops below a threshold and/or an energy storage component 602 should be replaced. The hardware processor generate user interface data for rendering a user interface to display relating to the operation of the energy storage assembly including the current charge of the energy storage assembly 600 and energy storage components thereof, an estimated mileage or time duration until the charge drops below a threshold and/or an energy storage component 602 should be replaced.

The energy storage assemblies shown and/or described herein may provide an easy-to-use system that eliminates complexities and dangers caused by traditional energy systems. For example, the energy storage assemblies herein may reduce or eliminate the use of wires which can erode overtime with use and may need to be replaced which can lead to unwanted expenses and potential hazards as wires can also be dangerous when broken or exposed. Further, extra space may be required in a given device or system to accommodate wires, thus the elimination of the wires can allow for greater design freedom. Wires can also store transient energy which can have negative impacts on electrical system performance and lead to inefficiencies in power transfer. Moreover, a user may not know how to couple wires together. The energy storage assemblies described herein can eliminate the problems associated with traditional energy systems.

Figure 7A:
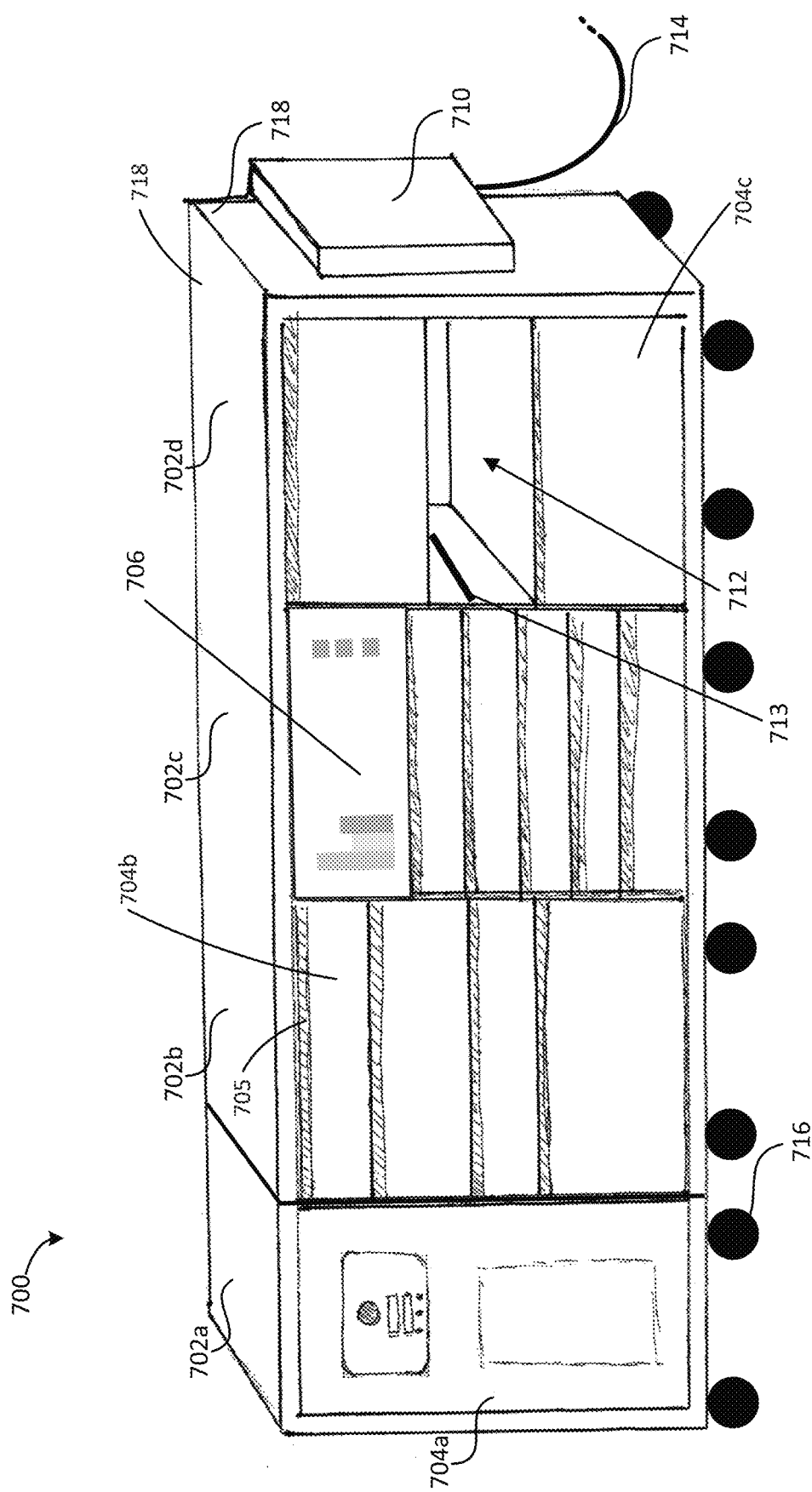
FIG. 7A is an example implementation of an energy management system including energy storage assemblies.

FIG. 7A is an example implementation of an energy management system 700. Energy management system 700 can be used to store, manage, and/or deliver energy to various electrical devices. Energy management system 700 can be assembled and/or placed for convenient access to energy stored therein. For example, energy management system 700 can be placed in a garage, shed, house, warehouse, barn, or the like to provide energy to individual devices or to provide energy to a power circuit, such as a building power circuit, a house power circuit etc. Energy management system 700 can receive and/or store energy from various energy sources and can determine which energy source to store energy from. Energy management system 700 can dynamically allocate the energy provided to various electrical devices based on consumption or data received by energy management system 700.

The energy management system 700 can include one or more energy storage assemblies 704, such as energy storage assemblies 704a, 704b, 704c, for example. For clarity, less than all of the energy storage assemblies 704 are labeled with a reference numeral in FIG. 7A. The energy storage assemblies 704 can include similar structural and/or operation features as any of the other example energy storage assemblies discussed herein. The energy management system 700 can include a user interface 706, and an electrical interface 710. The energy storage assemblies 704 can be arranged in groups, such as partitions 702a-702d of the energy management system 700.

The energy management system 700 can include one or more openings 712. For clarity, less than all of the openings 712 are labeled with a reference numeral in FIG. 7A. The energy storage assemblies 704 can be inserted and removed from openings 712 using guide tracks 713. Opening 712 labeled in FIG. 7A illustrates an opening wherein an energy storage assembly 704 has been removed such that the opening 712 does not contain an energy storage assembly 704. When an energy storage assembly 704 is inserted into an opening 712, the energy storage assembly 704 can mechanically and/or electrically connect to the energy management system 700. In some implementations, a plurality of the energy storage assemblies may be a uniform size and/or shape. In such implementations, a single opening 712 may receive more than one energy storage assembly 704 (e.g., one at a time). For example, a user may remove one energy storage assembly from an opening and replace it with another energy storage assembly in the same opening. In some implementations, a plurality of the energy storage assemblies 704 may be a different size and/or shape. For example, as shown energy storage assembly 704a may be a different size and/or shape than energy storage assembly 704b. The size and/or shape of the openings 712 may facilitate preventing receiving certain energy storage assemblies.

Energy storage assemblies 704 can include handles. For clarity, less than all of the handles are labeled with a reference numeral in FIG. 7A. As shown, energy storage assembly 704b is shown with handle 705. A user may grasp handle 705. The handle 705 can facilitate pushing and pulling the energy storage assembly 704b within the energy management system 700. The handle 705 can facilitate carrying the energy storage assembly 704b when energy storage assembly 704b is removed from the energy management system 700.

The energy storage assemblies 704 can be vertically arranged within the energy management system 700. The energy storage assemblies 704 can be stacked on top of one another in columns. Energy storage assemblies 704 can be horizontally arranged within the energy management system 700. The energy storage assemblies 704 can be positioned adjacent one another in rows. Energy storage assemblies 704 can be mechanically and/or electrically arranged into partitions 702a-702d. A partition 702 can include one or more energy storage assemblies 704. A partition 702 can include one or more energy storage assemblies 704 arranged vertically in a column. A partition 702 can include one or more energy storage assemblies 704 arranged horizontally in a row. A partition 702 can include a plurality of energy storage assemblies 704 electrically coupled together. A partition 702 can include a plurality of energy storage assemblies 704 mechanically coupled together. The energy stored within energy storage assemblies can be aggregated (e.g., in series or parallel). The energy of the energy storage assemblies 704 within a partition 702 can be aggregated. The partitions 702 can be removably electrically coupled to other partitions, such that the energy stored in partitions 702 is further aggregated. In the example implementation, each energy storage assembly 704 can be configured in series or parallel, relative to other energy storage assemblies 704, or disconnected from the other energy storage assemblies 704.

The partitions 702 can removably mechanically couple to other partitions and/or to the energy management system 700. For example, partition 702a may mechanically couple to partition 702b. In some implementations, a partition can removably mechanically coupled to any of the other partitions. For example, partition 702a may mechanically couple to partition 702b, 702c, or 702d. In some implementations, adjacent partitions 702 may be fixedly mechanically coupled to each other. For example, partition 702d may be fixedly mechanically coupled to partition 702c.

Energy management system 700 can include wheels 716. Wheels 716 can help facilitate the mobility of energy management system 700 in its entirety. For example, a user may push the energy management system 700 to a different location. Wheels 716 can help facilitate moving partitions 702. Each partition 702 can include wheels 716. Wheels 716 can facilitate physically displacing partitions 702 from each other and/or from the energy management system 700. For example, when a partition 702 is not mechanically coupled to the rest of the energy management system 700, the partition 702 can be easily moved by the wheels 716. For example, partition 702a can be mechanically decoupled from the energy management system 700 and moved away for storage, charging, or separate use.

Energy management system 700 can include housing 718. Housing 718 can include a rigid frame. Housing 718 can include electrically insulative material. Housing 718 can include components to facilitate mechanical coupling and/or decoupling of the energy storage assemblies 704 such as to each other and/or to the housing 718. Housing 718 can include components to facilitate electrical coupling and/or decoupling of the energy storage assemblies 704 such as to each other and/or to the housing 718. Housing 718 can include one or more openings 712. Housing 718 can receive energy storage assemblies 704. Housing 718 can receive energy storage assemblies 704 within openings 712. Energy storage assemblies 704 can fit within an interior region of housing 718. Energy storage assemblies 704 can mechanically and/or electrically couple to housing 718. Housing 718 can include terminals, guide tracks 713, electrical buses, internal wiring, and the like to facilitate mechanical and/or electrical coupling of the energy storage assemblies 704 such as to each other and/or to the housing 718.

Energy storage assemblies 704 can mechanically couple to the energy management system 700. Energy storage assemblies 704 can mechanically couple to other energy storage assemblies 704 to form a partition 702. Energy storage assemblies 704 to be easily added and removed from the energy management system 700 based on user need. The energy storage assemblies 704 and the energy management system 700 can include components such as slides, latches, clips and the like to facilitate coupling and/or decoupling. For example, an energy storage assembly 704 and an energy management system 700 can each include corresponding components such that the energy storage assembly 704 can be attached and removed from the energy management system 700. The components may also facilitate an electric coupling between an energy storage assembly 704 and the energy management system 700 or another energy storage assembly 704. For example, the components may include various electrical components such as wires, plugs, switches, and the like, such that when two components are connected, energy can be transferred through the components. In some instances, mechanically coupling an energy storage assembly 704 to the energy management system 700 or another energy storage assembly 704 causes an energy storage assembly to electrically to the energy management system 700 and/or to another energy storage assembly. In some instances, mechanically coupling an energy storage assembly 704 to the energy management system 700 or another energy storage assembly 704 does not establish an electric coupling. Guide tracks 713 can facilitate mechanical coupling between an energy storage assembly 704 and the energy management system 700. Guide tracks 713 can comprise terminals to facilitate the mechanical coupling of the energy storage assemblies 704 to one another and/or to the energy management system 700. An energy storage assembly 704 and/or a partition 702 may be decoupled from the energy management system 700. For example, an energy storage assembly 704 may be decoupled and used separately from the energy management system 700.

Energy storage assemblies 704 can electrically couple to the energy management system 700. Energy storage assemblies 704 can electrically couple to other energy storage assemblies 704 to form a partition 702. Energy storage assemblies 704 to be easily added or removed from an electrical configuration. Electrical coupling can occur in response to a mechanical coupling of an energy storage assembly 704 with another energy storage assembly 704 and/or with the energy management system 700. Guide tracks 713 can facilitate electrical coupling between an energy storage assembly 704 and the energy management system 700. For example, guide tracks 713 can include an electrically conductive material and the energy storage assemblies 704 can include electrically conductive material such that the electrical coupling is established when the energy storage assemblies 704 contact the guide tracks 713. Guide tracks 713 can comprise terminals to facilitate the electrical coupling of the energy storage assemblies 704 to one another and/or to an electrical bus in housing 718. In some instances, electrical coupling may occur independently of mechanical coupling. For example, an energy storage assembly 704 may electrically couple or decouple from other energy storage assemblies and/or the energy management system 700 while the energy storage assembly 704 is mechanically coupled within the energy management system 700. Electrical coupling can occur in response to a user input. Electrical coupling can happen automatically, such as in response to processor implemented logic. In some instances, electrical coupling can be facilitated by a switch array that can include a plurality of switches. The switches can each include states that allow electrical coupling to be established. The states of the switch array may be set by a controller contained in the energy management system 700.

The energy storage assemblies 704 can be electrically coupled in one or more electrical configurations. For example, one or more energy storage assemblies 704 may be electrically coupled together in series. As another example, energy storage assemblies 704 may be electrically coupled together in parallel. Voltages of various energy storage assemblies may sum together when energy storage assemblies are electrically coupled in series. When energy storage assemblies are electrically coupled in parallel, the energy storage assemblies may balance charge between themselves as they charge each other resulting in voltages of the energy storage assemblies averaging together across the energy storage assemblies. Energy storage assemblies coupled in series may provide a higher voltage to an electrical load than energy storage assemblies coupled in parallel or individual energy storage assemblies. Energy storage assemblies coupled in parallel or electrically isolated may accept energy more readily than energy storage assemblies coupled in series, at least because they have a lower voltage when coupled voltage when coupled in parallel or isolated than when coupled in series. A particular electrical coupling between energy storage assemblies 704 may also be referred to herein as an "electrical configuration of the energy management system 700" or an "electrical configuration". The electrical configuration may be set based on energy management system an energy source. For example, when the energy management system 700 is charging one or more energy storage assemblies 704, the energy storage assemblies 704 can be electrically coupled together in parallel. The electrical configuration can be changed based on load requirements. For example, when the energy management system 700 is discharging one or more energy storage assembly 704, the energy storage assemblies 704 can be electrically coupled together in series. In some implementations, energy storage assemblies 704 may electrically couple with any of the other energy storage assemblies in energy management system 700. In some implementations, energy storage assemblies 704 may electrically couple with energy storage assemblies in another partition. For example, an energy storage assembly 704 in partition 702*b* can electrically couple to an energy storage assembly 704 in partition 702*d*.

The electrical configuration of the energy management system 700 can be set and/or changed by physically placing and/or removing each energy storage assembly 704 from each opening 712. Additionally, the electrical configuration of the energy management system 700 can be set and/or changed using a user interface 706. For example, the user interface 706 can receive user input associated with how one or more energy storage assemblies 704 are electrically coupled together. The energy management system 700 can automatically change electrical coupling between the energy storage assemblies 704 based on the user input. For instance, the user interface 706 can receive user input that the energy storage assemblies 704 in partition 702*b* are to be electrically coupled in series, thereby aggregating the voltages of each energy storage assembly 704 such that partition 702*b* has an increased output voltage. In another instance, the user interface 706 can receive user input that the energy storage assemblies 704 in partition 702*d* are to be configured in parallel, thereby allowing each energy storage assembly 704 in partition 702*d* to be charged or discharged simultaneously as each of the other energy storage assembly 704 in partition 702*d*. In another instance, the user interface 706 can receive user input that an energy storage assembly 704 is to be removed from an electrical configuration, thereby removing the energy stored in the energy storage assembly 704 from the electrical configuration. In these instances, the removed energy storage assembly 704 can also be electrically isolated from other energy storage assemblies 704, allowing the removed energy storage assembly 704 to be charged and/or discharged individually. An electrical configuration can be set automatically, such as in response to processor implemented logic. In some instances, the electrical configuration can be set by a switch array and controller.

User interface 706 can receive user input. User interface 706 can receive user input regarding an electrical configuration as previously discussed. User interface 706 can receive energy source information, such as the voltage and power available from an energy source, the cost to utilize energy from the energy source, an energy source selection, energy source prioritization information, and the like. User interface 706 can receive electrical load information, such as the voltage and power required to operate an electrical load, a period of time to provide energy to the electrical load, energy limits the electrical load can draw, and the like.

User interface 706 may comprise an interactive graphical user interface. User interface 706 may comprise a touchscreen, such as a capacitive touch screen. User interface 706 may be disposed on the housing 718. In some implementations, user interface 706 may be remote to the housing 718. User interface 706 can comprise a mobile electronic device. User interface 706 may be a user interface or display screen of a user computing device such as a phone or computer. In some implementations, user interface 706 may removably couple with the housing 718. User interface 706 may comprise one or more hardware processors which may communicate via wireless and/or wired communication with one or more other hardware processors such as processors disposed within the housing 718. User interface 706 can display information. The displayed information can include energy source information, such as available energy sources, energy values of an associated energy source, a cost associated with the energy source, and the like. The displayed information can include information associated with the energy storage assemblies 704, such as the amount of energy stored in each energy storage assembly 704. The displayed information can include information relating to the electrical configuration of the energy management system 700. The displayed information can include information relating to electrical coupling between one or more energy storage assemblies 704. The displayed information can include information relating to a rate of charge and/or discharge of energy storage assemblies 704, and the voltage and/or total power stored in energy storage assemblies 704. The displayed information can include information associated with one or more electrical loads, such as an indication of the energy the electrical load is drawing from energy management system 700, the energy required to operate the electrical load, a total amount of time the electrical load can remain in operation, and the like. In some implementations, one or more hardware processors may display information on the user interface 706 and/or may display the same and/or different information on a remote user interface, such as a mobile electronic device such as a phone.

Energy management system 700 can include an electrical interface 710. The electrical interface 710 can electrically connect electrical loads. The electrical interface 710 can electrically connect energy sources. The electrical interface 710 can electrically connect to energy storage assemblies 704. The electrical interface 710 can electrically connect energy storage assemblies 704 and/or the energy management system 700 to one or more electrical loads. The electrical interface 710 can electrically connect energy storage assemblies 704 and/or the energy management system 700 to one or more energy sources.

The electrical interface 710 can include one or more wires or cables 714. The electrical interface 710 can include one or more plugs, such as a standard 110V plug, or a standard 220V plug. The electrical interface 710 can include one or more outlets, such as a standard 110V outlet, or a standard 220V outlet.

The electrical connection from the electrical interface 710 to the energy storage assemblies 704 can be configured such that the electrical interface 710 is connected to one or more groups of energy storage assemblies 704. For example, the electrical interface 710 can be connected to each column 702a-702d individually. In some instances, the groups of energy storage assemblies 704 is not defined by the physical location of the energy storage assemblies 704 but by charging and discharging requirements. For example, a discharging requirement can call for a specified voltage and a power threshold. In this example, a group of energy storage assemblies 704 can be defined by the selection of one or more energy storage assemblies that are required to match the specified voltage and exceed the power threshold. In another example a charging requirement can indicate a limited voltage and power threshold available from an energy source. In this example, a group of energy storage assemblies 704 can be defined by the selection of one or more energy storage assemblies that can receive, and store, energy based on the limited voltage and power threshold. In these examples, the groups of energy storage assemblies 704 can be configured physically and/or through a user interface 706 as discussed previously.

The electrical interface 710 can interface with one or more electrical loads. The electrical loads can be individual devices, such as computers, appliances, vehicles, or the like. The electrical loads can be electrical systems, electrical grids, such as a building electrical grid, or a municipal electrical grid. The interface between the electrical interface 710 and an electric load allows the electric load to draw energy from one or more of the energy storage assemblies 704. In some implementations, the interface between the electrical interface 710 and an electrical load acts as a pass through to one or more energy sources other than energy management system 700, such as the energy sources discussed below. For example, the interface between the electrical interface 710 and an electrical load can allow for the electrical load to connect directly to a power grid. energy management system In some implementations, the electrical interface 710 can facilitate the generation of a discharging requirement. For example, electrical interface 710 can include one or more sensors, such as voltage and current sensors, that are configured to read the power state of connected electrical loads. In this example, connection interface can use the included sensors to read the voltage and power required to operate the electrical load. In another example, the electrical interface 710 can receive data input from the user interface 706, or from other sources, that provide the discharging requirement. For example, a user can input the discharging requirement into the user interface 706. In another example, the discharging requirement can be received through a data connection, such as a wired or wireless connection. In another example, the discharging requirement can be received through data collected through a network connection, such as a connection to the Internet.

According to this implementation, the electrical interface 710 is configured to interface with one or more energy sources, such as a power grid, a solar panel grid, a portable generator, a portable battery, and the like. The interface between the electrical interface 710 and an energy source allows energy to be drawn from the energy source and stored in one or more of the energy storage assemblies 704. In some implementations, the interface between the electrical interface 710 and the energy source allows the energy management system 700 to pass energy from the energy source directly to one or more electrical loads.

In some implementations, the electrical interface 710 can facilitate the generation of a charging requirement. For example, electrical interface 710 can include one or more sensors, such as voltage and current sensors, that are configured to read the power state of connected energy sources. In this example, the electrical interface 710 can use the included sensors to read the available voltage of an energy source and an available power threshold the energy source can provide. In another example, electrical interface 710 can receive data input from the user interface 706, or from other sources, that provide the charging requirement. For example, a user can input the charging requirement into the user interface 706. In another example, the charging requirement can be received through a data connection, such as a wired or wireless connection, to the energy source. In another example, the charging requirement can be received through data collected through a network connection, such as a connection to the Internet.

In some implementations, the connection interface 710 can include one or more power converters. The power converters can be utilized in the interface between electrical interface 710 and energy sources and in the interface between electrical interface 710 and the electrical loads. The power converters, in conjunction with the energy storage assembly 704 electrical configurations, can be used to optimize power transfer between the energy sources, the energy storage assemblies 704, and the electrical loads. For example, electrical interface 710 can generate a discharge requirements associated with an electric load. In this example, energy management system 700 cannot have an electrical configuration of energy storage assemblies 704 that matches a specified voltage included in the discharge requirements. To compensate, the energy storage assemblies 704 can be configured to satisfy the power required to operate the electric load and electrical interface 710 can utilize the power converters to step up and/or step down the voltage of the electrical configuration such that the voltage matches the specified voltage.

Figure 7B:
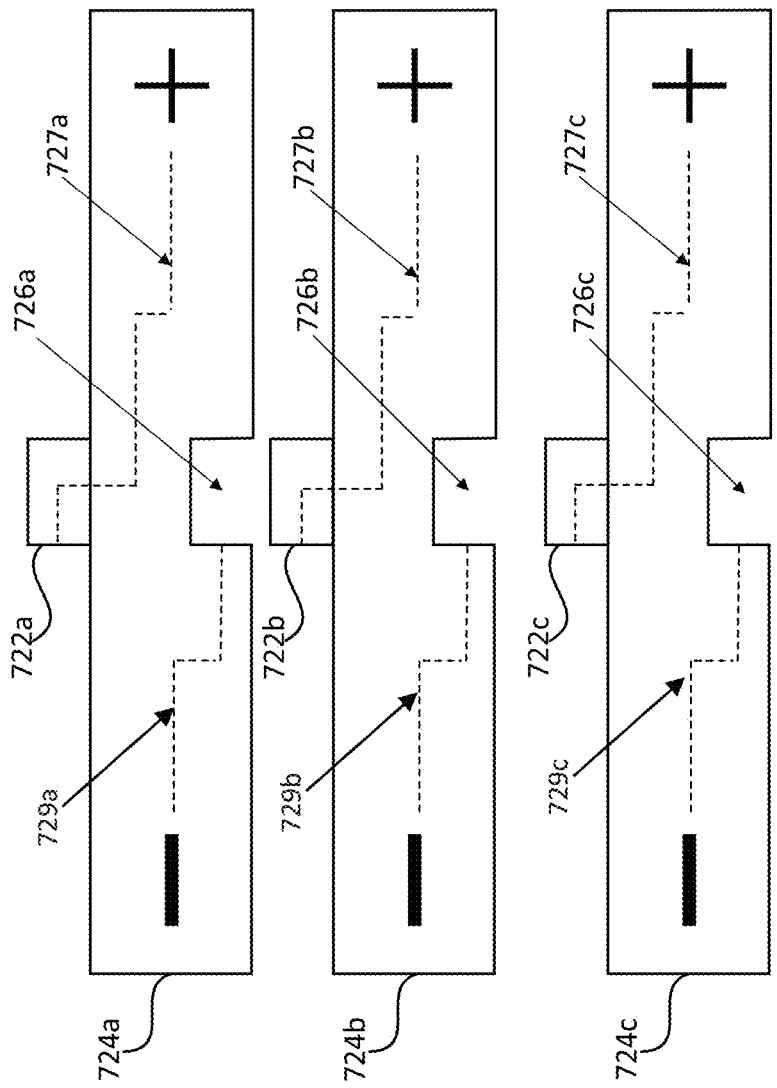
FIGS. 7B-7C and 8A-8B illustrate example implementations of energy storage assemblies.

FIG. 7B depicts an example implementation of energy storage assemblies 724 (e.g., energy storage assemblies 724a, 724b, 724c). Energy storage assemblies 724 may be implemented in an energy management system such as energy management system 700 shown and/or described herein. Energy storage assemblies 724 can include a positive side, a negative side, a connector block 722, a receptacle 726 and electrically conductive paths 727, 729. Energy storage assemblies 724 can mechanically couple to one another. Energy storage assemblies 724 can electrically couple to one another. Energy storage assemblies 724 can be mechanically coupled together by stacking the energy storage assemblies 704 such that the connector block 722 of one energy storage assembly 704 is inserted into the receptacle 726 of another energy storage assembly 704. In the illustrated implementation, the connector block 722b is inserted into the receptacle 726a and the connector block 722c is inserted into receptacle 726b. Mechanically coupling energy storage assemblies 724 may cause the energy storage assemblies 724 to electrically couple.

Electrically conductive path 727 may electrically connect a positive side of energy storage assembly 724 to the connector block 722. Electrically conductive path 729 may electrically connect a negative side of energy storage assembly 724 to the receptable 726. Electrically conductive path 727c can electrically connect with electrically conductive path 729b. The positive side of energy storage assembly 724c may electrically connect to the negative side of energy storage assembly 724b. Energy storage assembly 724c may electrically connect to energy storage assembly 724b in series. Electrically conductive path 727b can electrically connect with electrically conductive path 729a. The positive side of energy storage assembly 724b may electrically connect to the negative side of energy storage assembly 724a. Energy storage assembly 724b may electrically connect to energy storage assembly 724a in series. FIG. 7B is provided as an example and is not intended to be limiting. In some implementations, more than three energy storage assemblies 724 may be coupled together. In some implementations, fewer than three energy storage assemblies 724 may be coupled together.

The example implementation illustrates a connection path as the energy storage assemblies 704 are stacked. As is illustrated, when an energy storage assembly 704 is stacked on top of another energy storage assembly 704, an end-to-end series connection is established between the negative terminal of the top energy storage assembly 704 into the positive terminal of the bottom energy storage assembly 704. As such the two connected energy storage assemblies 704 are connected in series and the energy stored on each can be aggregated. As shown, when energy storage assemblies 724 are mechanically and electrically coupled, the positive sides may be positioned adjacent to one another, and the negative sides may be positioned adjacent to one another.

The connector block 722 of the topmost energy storage assembly 704 in a stack and the receptacle 726 of the bottommost energy storage assembly 704 in the stack can operate as the positive and negative terminals for the electrically coupled energy storage assemblies 704. In the illustrated example, connector block 722a operates as a positive terminal and receptacle 726c operates as a negative terminal for the electrically coupled energy storage assemblies 704.

Figure 7C:
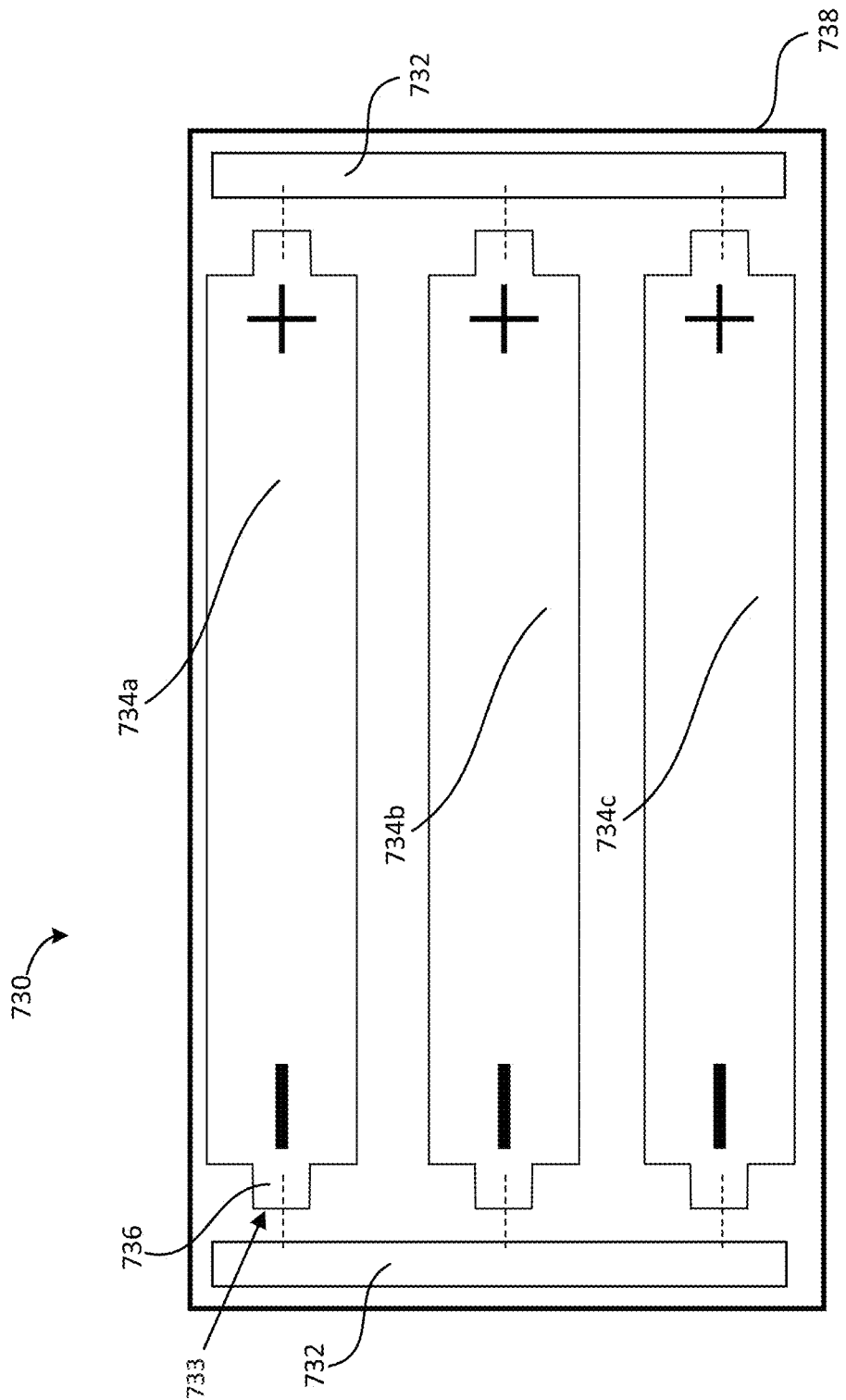

FIG. 7C depicts an example implementation of an energy management system 730. Energy management system 730 can include similar structural and/or operational features as energy management system 700 shown and/or described herein. Energy management system 730 can include storage assemblies 734 (e.g., energy storage assemblies 734a, 734b, 734c). Energy storage assemblies 734 can include a positive side and a negative side and guide rails 736. Energy management system 730 can include guide tracks 733 and connector buses 732. Energy management system 730 can include housing 738. Housing 738 can include a rigid frame. Housing 738 can include electrically insulative material. Housing 738 can include components to facilitate mechanical coupling and/or decoupling of the energy storage assemblies 734 such as to each other and/or to the housing 738. Housing 738 can include components to facilitate electrical coupling and/or decoupling of the energy storage assemblies 734 such as to each other and/or to the housing 738. Housing 738 can receive energy storage assemblies 734. Energy storage assemblies 734 can fit within an interior region of housing 738. Energy storage assemblies 734 can mechanically and/or electrically couple to housing 738. Housing 738 can include terminals, electrical buses, internal wiring, and the like to facilitate mechanical and electrical coupling. Housing 738 can include guide tracks 733. Guide tracks 733 can comprise terminals to facilitate the mechanical and/or electrical coupling of the energy storage assemblies 734 to housing 738 and/or to each other.

Guide tracks 733 can receive guide rails 736. Energy storage assemblies 734 can mechanically couple to the energy management system 730. Energy storage assemblies 734 can electrically couple to the energy management system 730. Energy storage assemblies 734 can electrically couple to the connector buses 732. The guide rails 736 can establish an electrical coupling between the energy storage assemblies 734 and the connector buses 732. The connector buses 732 may be electrically coupled to one another. The connector buses 732 may be electrically coupled to a control module. The connector buses 732 may be electrically coupled to switches, transistors, diodes, wires, or the like. The energy management system 730 can the energy storage assemblies 704 such as in series and/or parallel. In some implementations the configuration of the connector buses 732 is established manually or automatically through a user interface 706.

Figure 8A:
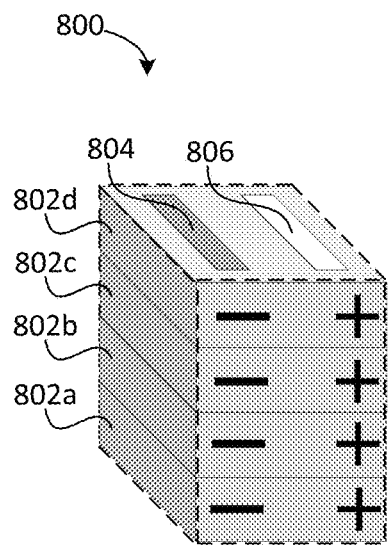
Figure 8B:
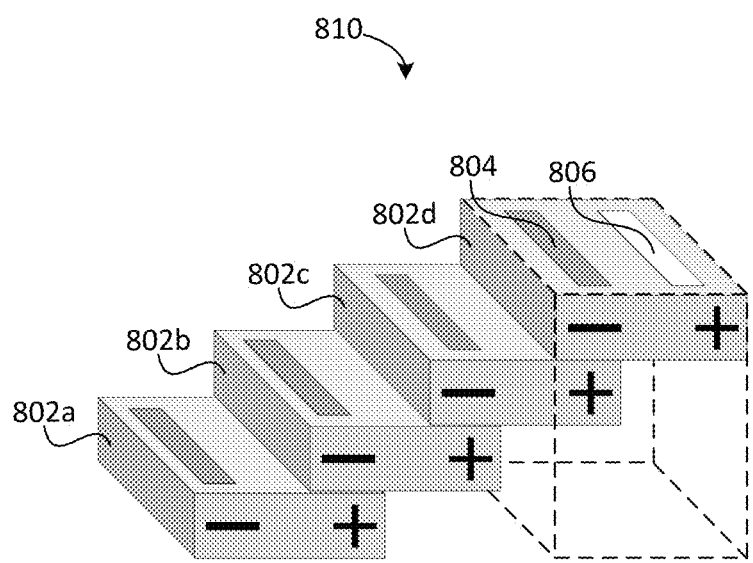

FIGS. 8A and 8B depict examples of energy storage assemblies 802 manually switching between parallel configuration and series configuration. Each energy storage assembly 802 includes a positive terminal 806 and negative terminal 804. The positive terminals 806 and negative terminals 804 can be accessed from the top and/or bottom of an energy storage assembly 802. The positive terminals 806 and negative terminals 804 can be exposed on a top and/or bottom surface of an energy storage assembly 802. The positive terminals 806 and negative terminals 804 can be flush with a top and/or bottom surface of an energy storage assembly 802.

FIG. 8A depicts energy storage assemblies 802 arranged in a parallel configuration 800. When energy storage assemblies 802 are arranged in the parallel configuration 800, the negative terminal 804 of each energy storage assembly 802 electrically connects with the negative terminal 804 of any adjacent energy storage assembly 802, thereby electrically coupling each negative terminal 804 together. Similarly, when energy storage assemblies 802 are arranged in the parallel configuration 800, the positive terminal 806 of each energy storage assembly 802 electrically connects with the positive terminal 806 of any adjacent energy storage assembly 802, thereby electrically coupling each positive terminal 806 together. FIG. 8A depicts energy storage assemblies 802 arranged vertically with respect to one another. In some implementations, energy storage assemblies 802 may be arranged vertically with respect to one another when arranged in parallel. In some implementations, energy storage assemblies 802 may be arranged vertically with respect to one another when arranged in series.

FIG. 8B depicts energy storage assemblies 802 arranged in a series configuration 810. When energy storage assemblies 802 are arranged in the series configuration 810, the negative terminal 804 of an energy storage assembly 802 is connected to a positive terminal 806 of an adjacent energy storage assembly 802 and positive terminal 806 is connected to a negative terminal 804 of a different adjacent energy storage assembly 802. For example, FIG. 8B illustrates the negative terminal 804 of energy storage assembly 802b connected to the positive terminal 806 of energy storage assembly 802a. Continuing the example, the positive terminal 806 of energy storage assembly 802b is connected to the negative terminal 804 of energy storage assembly 802c. If an energy storage assembly 802 is positioned on the end of the series configuration 810 either the positive or negative terminal 804 will be left open. For example, FIG. 8B illustrates the negative terminal 804 of energy storage assembly 802a and the positive terminal 806 of energy storage assembly 802d as open. The open terminals can be electrically connected to charge and/or discharge the series configuration 810. FIG. 8B depicts energy storage assemblies 802 displaced with respect to one another. In some implementations, energy storage assemblies 802 may be displaced with respect to one another when arranged in parallel. In some implementations, energy storage assemblies 802 may be displaced with respect to one another when arranged in series.

A user may transition the energy storage assemblies 802 between series and parallel by manually displacing adjacent energy storage assemblies 802. For example, a user may slide energy storage assemblies 802 between configurations shown and/or described in FIGS. 8A-8B. In some implementations, energy storage assemblies 802 may be arranged in a combination of series and parallel. For example, energy storage assemblies 802d and 802c may be electrically coupled in parallel as shown in FIG. 8A while energy storage assemblies 802b and 802a are electrically coupled in series as shown in FIG. 8B. Energy storage assemblies 802 may be implemented in any of the example energy management systems shown and/or described herein.

Figure 9:
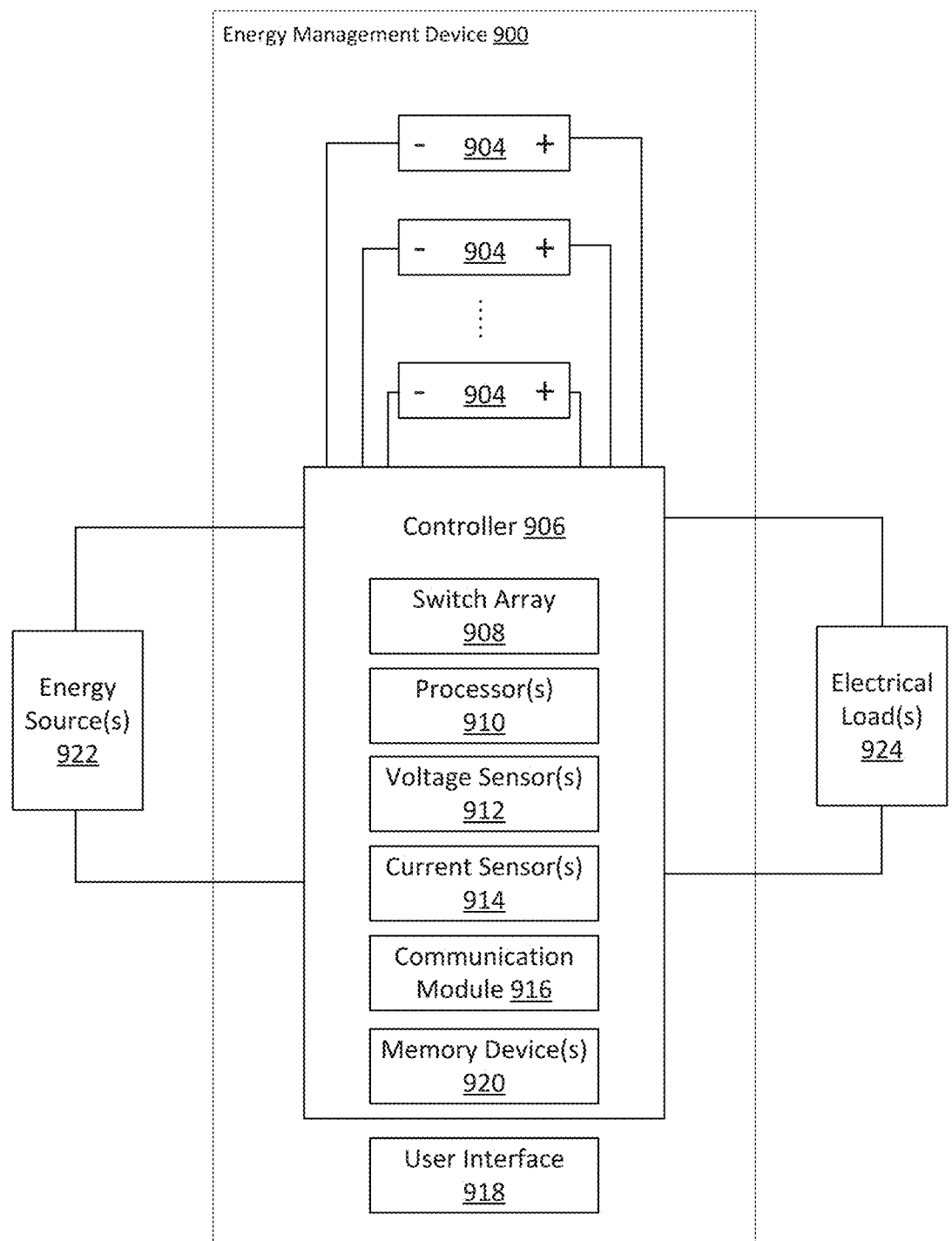
FIG. 9 is a schematic diagram of an example energy management system.

FIG. 9 is a schematic diagram of an example energy management system 900. The energy management system 900 can include one or more energy storage assemblies 904, a controller 906, and a user interface 918. The energy management system 900 can electrically couple to one or more energy sources 922. The energy management system 900 can electrically couple to one or more electrical loads 924. The energy management system 900 can facilitate the charging of the one or more energy storage assemblies 904 and operation of the one or more electrical loads 924.

The controller 906 can include a switch array 908, one or more processors 910, one or more voltage sensors 912, one or more current sensors 914, a communication module 916, and one or more memory devices 920. The switch array 908 can include one or more switches, relays, transistors, and/or any other device used to reconfigure electrical connections between devices. The switch array 908 can include one or more single pole, single throw switches. The switch array 908 can include one or more single pole, multi-throw switches. The switch array 908 can include one or more multi-pole, single-throw switches. The switch array 908 can include one or more multi-pole, multi-throw switches. The switch array 908 can electrically connect to each of the energy storage assemblies 904 such that the switch array 908 can electrically couple or decouple one or more energy storage assemblies 904 with each other. The switch array 908 can electrically couple one or more energy storage assemblies 904 in parallel. The switch array 908 can electrically couple one or more energy storage assemblies 904 in series. Each group of energy storage assemblies 904 can include one or more energy storage assemblies 904 connected in series or parallel. The switch array 908 can electrically connect to the one or more energy sources 922. The switch array 908 can electrically connect to the one or more electrical loads 924. The switch array 908 can electrically couple or decouple the energy sources 922 with the energy storage assemblies 904. The switch array 908 can electrically couple or decouple the electrical loads 924 with the energy storage assemblies 904. In some implementations, the switch array 908 can be configured to pass an energy source 922 connection directly to an electrical load 924. The switch array 908 can exist in one or more electrical states. The switch array 908 can transition between one or more electrical states.

The one or more energy sources 922 can include a solar energy source, a wind energy source, a hydro-electric energy source, a generator, a utility grid, or the like.

The voltage sensor(s) 912 and current sensor(s) 914 can gather voltage, current, and other data from the energy source(s) 922, the electrical load(s) 924, and/or one or more energy storage assemblies 904. The data can be communicated to the processor(s) 910.

The user interface 918 can facilitate communication between a user and the energy management system 900. The user interface 918 can receive information and/or instructions from a user, such as changes to an electrical configuration, an energy source selection, an electrical load connection, and the like. The user interface 918 can include similar operational and/or structural features of user interface 706 shown and/or described herein.

The processor(s) 910 can include one or more hardware computer processors configured to execute program instructions to cause the energy management system 900 to perform one or more operations. The processors(s) 910 can be configured, among other things, to process data, execute instructions to perform one or more functions, and/or control the operation of the controller 906 or components thereof. The processor(s) 910 can access data in the memory device 920. The processor(s) 910 can access data collected by the voltage sensor 912 and/or the current sensor 914. The processor(s) 910 can access data obtained by the communication module 916. The processor(s) 910 can access data received via the user interface 918. The processor(s) 910 can access data and can execute instructions to perform functions related to storing, processing, and/or transmitting such data. In some implementations, the processor(s) 910 can be remote the energy management system 900. For example, the processor(s) 910 may be implemented on a server remote to the energy management system 900.

The processor(s) 910 can access data relating to an operation of the energy sources 922 such as an amount of available energy at the energy sources 922, a voltage level of energy sources 922, a cost of energy at the energy sources 922, a time of availability of energy at the energy sources 922, estimated future data relating to energy at the energy sources 922, etc. The processor(s) 910 can access data relating to an operation of the electrical loads 924 such as energy requirements of the electrical loads 924, rate of energy consumption of the electrical loads 924, estimated future energy requirements of the electrical loads 924, etc.

The processor(s) 910 can generate user interface data for rendering user interfaces. The processor(s) 910 can communicate user interface data to the communication module 916. The processor(s) 910 can communicate user interface data to the user interface 918 for the user interface to render one or more user interfaces.

The controller 906 can include one or more memory devices 920 that store data, including without limitation, dynamic and/or static random access memory (RAM), programmable read-only memory (PROM), erasable programmable read-only memory (EPROM), electrically erasable programmable read-only memory (EEPROM), and the like. Such stored data can be processed and/or unprocessed energy data obtained from voltage sensors 912, the current sensors 914, communication module 916, user interface 918, etc.

The communication module 916 can facilitate communication (via wired and/or wireless connection) between the energy management system 900 (and/or components thereof) and separate devices, such as energy sources 922, electrical loads 924, external sensors, systems, servers, databases, users, user computing devices, phones, tablets, computers, wearable devices, home automation systems, vehicles, or the like. For example, the communication module 916 can be configured to allow the energy management system 900 to wirelessly communicate with other devices, systems, and/or networks over any of a variety of communication protocols. The communication module 916 can be configured to use any of a variety of wireless communication protocols, such as Wi-Fi (802.11x), Bluetooth®, Zig-Bee®, Z-wave®, cellular telephony, infrared, near-field communications (NFC), RFID, satellite transmission, proprietary protocols, combinations of the same, and the like. The communication module 916 can allow data and/or instructions to be transmitted and/or received to and/or from the energy management system 900 and separate computing devices. The communication module 916 can be configured to transmit and/or receive (for example, wirelessly) processed and/or unprocessed energy data with separate computing devices including voltage and current sensors, energy sources, electrical loads, remote servers, users, user computing devices, or the like. The communication module 916 can be embodied in one or more components that are in communication with each other. The communication module 916 can include a wireless transceiver, an antenna, and/or a near field communication (NFC) component such as a transponder.

The processor(s) 910 can control an operation of the switch array 908. The processor(s) 910 can cause the switch array 908 to transition between one or more electrical states. The processor(s) 910 can determine an electrical configuration for the switch array 908. The processor(s) 910 can determine whether one or more energy sources 922 should be electrically coupled to one or more energy storage assemblies 904. The processor(s) 910 can determine whether one or more energy storage assemblies 904 should be electrically coupled with each other. The processor(s) 910 can determine whether one or more energy storage assemblies 904 should be electrically coupled in series and/or in parallel. The processor(s) 910 can determine whether one or more energy storage assemblies 904 should be electrically coupled with one or more electrical loads 924.

The processor(s) 910 can control the switch array 908 based on data stored in memory devices 920. The processor(s) 910 can control the switch array 908 based on data received by the communication module 916. The processor(s) 910 can control the switch array 908 based on data obtained by the voltage sensor 912. The processor(s) 910 can control the switch array 908 based on data obtained by the current sensor 914. The processor(s) 910 can control the switch array 908 based on data received via the user interface 918.

The processor(s) 910 can determine an optimal group of one or more energy storage assemblies 904 and cause the switch array 908 to connect the optimal group to an electrical load 924. In some implementations, the processor(s) 910 can determine an energy source 922 and cause the switch array 908 to electrically connect the determined energy source 922 and an electrical load 924.

Figure 10A:
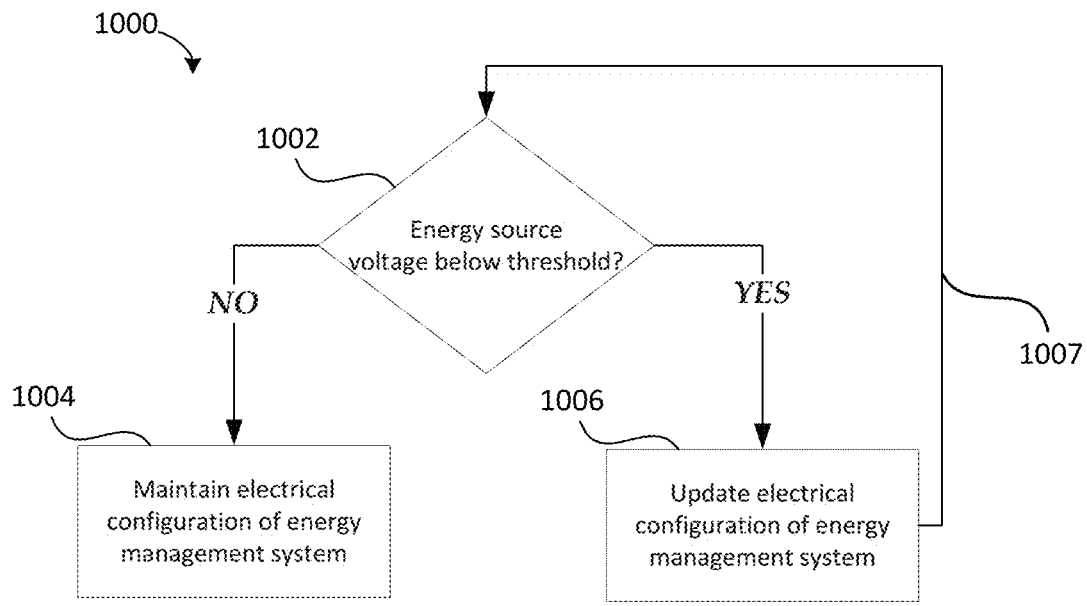
FIGS. 10A-10D illustrate example processes for determining electrical configurations.

FIG. 10A illustrates an example process 1000 for determining an electrical configuration of an energy management system. Process 1000, or portions thereof, can be executed by a hardware processor, such as processor(s) 910 shown and/or described herein. Process 1000, or portions thereof, can be implemented in an energy management system such as in any of the example energy management systems shown and/or described herein. Process 1000 is provided as an example and is not intended to be limiting of the present disclosure. In some implementations, the processor can omit portions of the process 1000, can add additional operations, and/or can rearrange an order in which the operations of the process 1000 are executed.

At decision block 1002, the processor can determine if an energy source voltage is below a threshold. The threshold can be determined based on a predetermined threshold. The threshold can be based on a voltage of one or more energy storage assemblies. In some instances, a determination that the energy source voltage is below a threshold can indicate that the energy source does not have sufficient energy to charge one or more energy storage assemblies in their electrical configuration. For example, the processor may determine that an energy source voltage is below a threshold if the energy source voltage is less than the combined voltage of one or more energy storage assemblies electrically coupled in series. If the processor determines that the energy source voltage is below the threshold, then process 1000 proceeds to block 1006. If the processor determines that the energy source voltage is not below the threshold, then process 1000 proceeds to block 1004.

At block 1004, the processor can maintain the electrical configuration of the energy management system. For example, the processor may not cause the switch array to transition between electrical states to change the electrical configuration of the energy storage assemblies. In some implementations, once block 1004 is reached, process 1000 is not repeated until a change occurs such as a change in the energy source and/or a change in the energy storage assemblies. For example, the energy source can be changed to a different energy source. In another example, the energy source power changes. For instance, the sunlight radiating a solar panel array can vary, causing the power output of the solar panel array to change. In these implementations, process 1000 can restart at decision block 1002 when the change in the energy source power occurs. In some implementations, the energy management system can maintain the electrical configuration at block 1004 to charge an energy storage assembly until the energy storage assembly has reached a threshold voltage or energy level. The energy management device may then update the electrical configuration such as by electrically coupling the energy source to a different energy storage assembly to charge the different energy storage assembly. The processor can cause a switch array to transition between states to cause multiple energy storage assemblies to be charged sequentially. The processor can determine an order in which to charge multiple energy storage assemblies based on at least a voltage level of the energy storage assemblies. The processor can cause an energy source to charge multiple energy storage assemblies sequentially in an order corresponding to their charge levels. The processor can cause the energy source to charge the energy storage assembly with the lowest voltage level to charge first until it reaches a threshold voltage and then can cause the energy source to charge a subsequent energy storage assembly. The threshold voltage can be an absolute voltage. The threshold voltage can be a relative voltage relative to voltages of other energy storage assemblies.

At block 1006, the processor can update the electrical configuration of the energy management system. The processor can update the electrical configuration by causing the switch array to transition between electrical states. The processor can update the electrical configuration by causing the switch array to electrically decouple one or more energy storage assemblies from the energy source. The processor can update the electrical configuration by causing the switch array to electrically couple one or more energy storage assemblies in parallel. The processor can update the electrical configuration by causing the switch array to electrically decouple one or more energy storage assemblies from a series configuration. The processor can update the electrical configuration by causing the switch array to electrically couple a different energy source to one or more energy storage assemblies. In some implementations, the processor can update the electrical configuration by generating instructions for a user to change the electrical configuration. For example, the processor may generate user interface data to render a user interface including instructions to a user to electrically decouple or couple one or more energy storage assemblies. A user may manually change electrical coupling between energy storage assemblies and/or energy sources as shown and/or described herein. After block 1006 has been executed process 1000 proceeds along feedback 1007 to decision block 1002 and the process 1000 can repeat until decision block 1002 is no longer satisfied and/or all energy storage assemblies of energy management system 900 have been added to the electrical configuration.

Figure 10B:
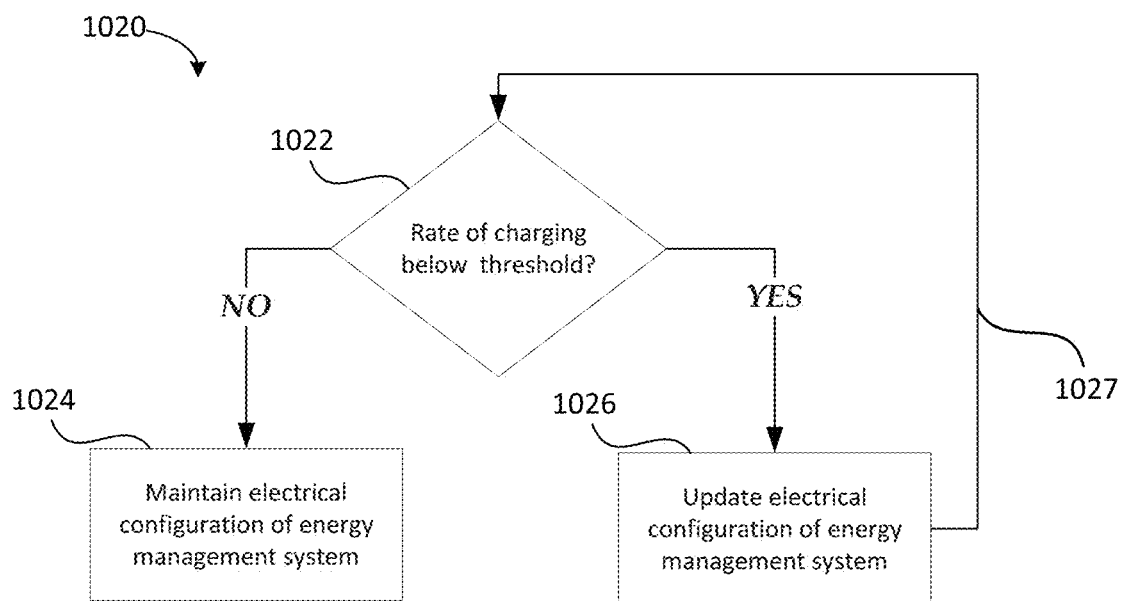

FIG. 10B illustrates an example process 1020 for determining an electrical configuration of an energy management system. Process 1020, or portions thereof, can be executed by a hardware processor, such as processor(s) 910 shown and/or described herein. Process 1020, or portions thereof, can be implemented in an energy management system such as in any of the example energy management systems shown and/or described herein. Process 1020 is provided as an example and is not intended to be limiting of the present disclosure. In some implementations, the processor can omit portions of the process 1020, can add additional operations, and/or can rearrange an order in which the operations of the process 1020 are executed.

At decision block 1022, the processor can determine if a rate of charging is below a threshold. The threshold can be determined based on a predetermined threshold. The threshold can be based user input and/or sensor data. For example, a user can indicate that one or more energy storage assemblies should be fully charged by a set time. In some instances, a determination that the rate of charge has fallen below the threshold value can indicate that the energy source does not have sufficient energy to charge the energy storage assemblies in the current electrical configuration. For example, energy storage assemblies may be arranged in series with a large total voltage or may include many energy storage assemblies arranged in parallel. If the processor determines that the rate of charge falls below the threshold value, then process 1020 proceeds to block 1026. If the processor determines that the determines that the rate of charge does not fall below the threshold value, then process 1020 proceeds to block 1024.

At block 1024, the processor can maintain the electrical configuration of the energy management system. For example, the processor may not cause the switch array to change the electrical configuration of the energy storage assemblies 904. In some implementations, once block 1024 is reached, process 1020 is not repeated until a change occurs such as a change in the energy source and/or energy storage assemblies. For example, the energy source can be changed to a different energy source. In another example, the energy source charging capabilities change. For instance, the availability of power at the energy source can increase, allowing for an increased rate of charge. In these implementations, process 1020 can restart at decision block 1022 when the change in the energy source occurs.

At block 1026, the processor can update the electrical configuration of the energy management system. The processor can update the electrical configuration by causing the switch array to transition between electrical states. The processor can update the electrical configuration by causing the switch array to electrically decouple one or more energy storage assemblies from the energy source. The processor can update the electrical configuration by causing the switch array to electrically couple one or more energy storage assemblies in parallel. The processor can update the electrical configuration by causing the switch array to electrically decouple one or more energy storage assemblies from a series configuration. The processor can update the electrical configuration by causing the switch array to electrically couple a different energy source to one or more energy storage assemblies. In some implementations, the processor can update the electrical configuration by generating instructions for a user to change the electrical configuration. For example, the processor may generate user interface data to render a user interface including instructions to a user to electrically decouple or couple one or more energy storage assemblies. A user may manually change electrical coupling between energy storage assemblies and/or energy sources as shown and/or described herein. The processor can cause the switch array to disconnect an energy storage assembly from a parallel electrical configuration. The energy storage assembly to be removed can be selected based on user input and/or the available storage of the connected energy storage assembly. After block 1026 has been executed process 1020 proceeds along feedback 1027 to decision block 1022 and the process 1020 can repeat until decision block 1022 is no longer satisfied and/or the electrical configuration includes a single energy storage assembly.

Figure 10C:
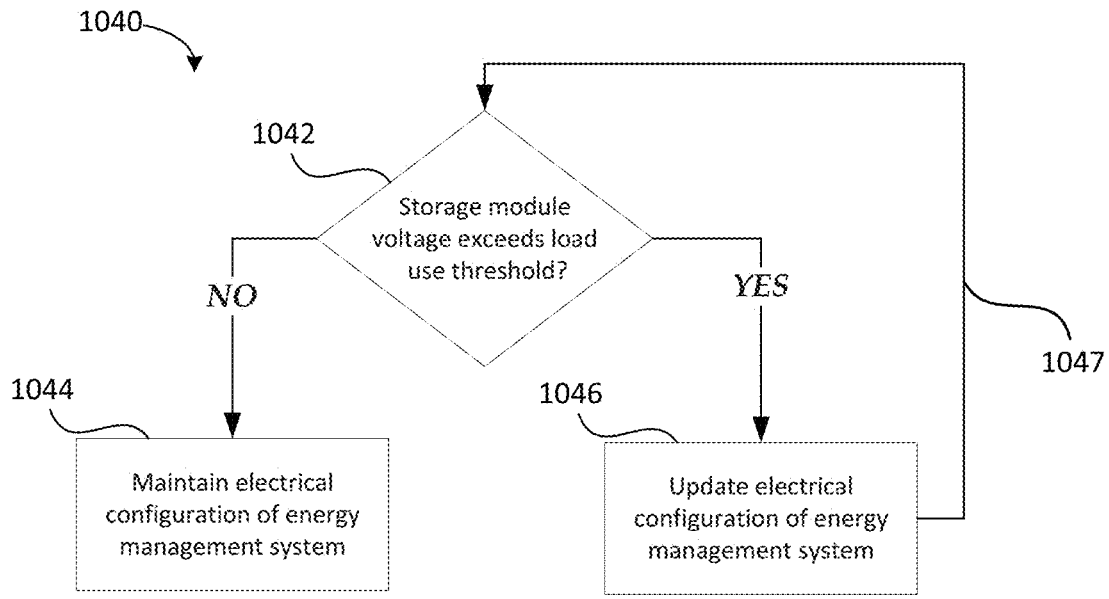

FIG. 10C illustrates an example process 1040 for determining an electrical configuration of an energy management system. Process 1040, or portions thereof, can be executed by a hardware processor, such as processor(s) 910 shown and/or described herein. Process 1040, or portions thereof, can be implemented in an energy management system such as in any of the example energy management systems shown and/or described herein. Process 1040 is provided as an example and is not intended to be limiting of the present disclosure. In some implementations, the processor can omit portions of the process 1040, can add additional operations, and/or can rearrange an order in which the operations of the process 1040 are executed.

At decision block 1042, the processor determines if the output voltage of the electrical configuration exceeds a load use threshold value. The threshold value can be determined based user input and/or sensor data. For example, a user can indicate a target voltage to output to the electrical loads. As another example, sensor data can indicate the voltage requirements of the electrical load. In some instances, a determination that the output voltage of the electrical configuration exceeds the threshold value can signal that the electrical configuration will overload the electrical load if energy is output to the electrical load. In these instances, an overloaded electrical load can become defective or dangerous. If the processor determines the output voltage of the electrical configuration exceeds the load use threshold value, then process 1040 proceeds to block 1046. If the processor determines the output voltage of the electrical configuration does not exceed the load use threshold value, then process 1040 proceeds to block 1044.

At block 1044, the processor maintains the electrical configuration. For example, the processor will not send and instruction to the switch array 908 to change the electrical configuration of the energy storage assemblies 904. In some implementations, once block 1044 is reached, process 1040 is not repeated until a change occurs in the electrical load. For example, the electrical load can be changed to a different electrical load. In some implementations, once block 1044 is reached, process 1040 is not repeated until a change occurs in the energy storage assemblies. For example, the electrical configuration of the energy storage assemblies can be changed. In these implementations, process 1040 can restart at decision block 1042 when the change in the electrical load occurs.

At block 1046, the processor causes an energy storage assembly to be disconnected from the electrical configuration. The processor can update the electrical configuration by causing the switch array to transition between electrical states. The processor can update the electrical configuration by causing the switch array to electrically decouple one or more energy storage assemblies from the electrical load. The processor can update the electrical configuration by causing the switch array to electrically decouple one or more energy storage assemblies from a parallel configuration. In some implementations, the processor can update the electrical configuration by generating instructions for a user to change the electrical configuration. For example, the processor may generate user interface data to render a user interface including instructions to a user to electrically decouple or couple one or more energy storage assemblies. A user may manually change electrical coupling between energy storage assemblies and/or energy sources as shown and/or described herein. The processor can cause the switch array to disconnect an energy storage assembly from a parallel electrical configuration. The energy storage assembly to be removed can be selected based on user input and/or the available storage of the connected energy storage assembly. After block 1046 has been executed process 1040 proceeds along feedback 1047 to decision block 1042 and the process 1040 can repeat until decision block 1042 is no longer satisfied and/or the no energy storage assembly is included in the electrical configuration.

Figure 10D:
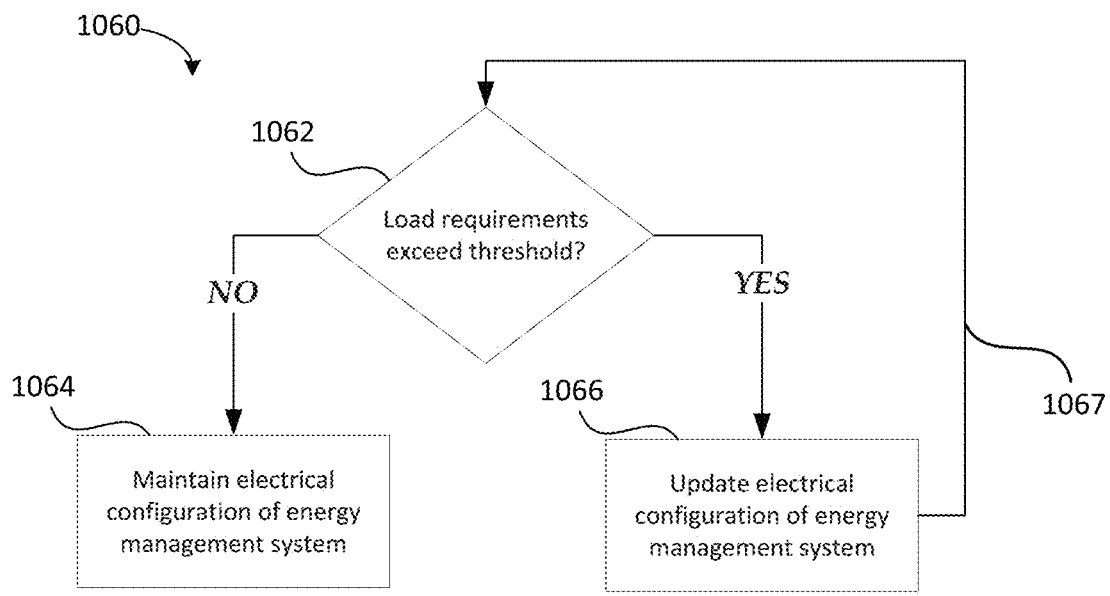

FIG. 10D illustrates an example process 1060 for determining an electrical configuration of an energy management system. Process 1060, or portions thereof, can be executed by a hardware processor, such as processor(s) 910 shown and/or described herein. Process 1060, or portions thereof, can be implemented in an energy management system such as in any of the example energy management systems shown and/or described herein. Process 1060 is provided as an example and is not intended to be limiting of the present disclosure. In some implementations, the processor can omit portions of the process 1060, can add additional operations, and/or can rearrange an order in which the operations of the process 1060 are executed.

At decision block 1062, the processor can determine whether the load requirements exceed a threshold. The load requirements can be based on operating voltage of the load, rate of energy consumption, estimated future operating voltage or energy consumption of the load, etc. The threshold can be based on voltage of energy storage assemblies. The processor can determine that the load requirements exceed a threshold if an operating voltage of the attached electrical load exceeds the total output voltage of the energy storage assemblies. The processor may determine the load requirements based on user input and/or sensor data. For example, a user can indicate a voltage required to operate the electrical load. As another example, sensor data can indicate the voltage requirement to operate the electrical load. In some instances, a determination that the load requirements exceed a threshold can indicate that the electrical configuration has insufficient voltage to power the electrical load. If the processor determines that load requirements exceed a threshold, then process 1060 proceeds to block 1066. If the processor determines that load requirements do not exceed a threshold, then process 1060 proceeds to block 1064.

At block 1064, the processor can maintain the electrical configuration of the energy management system. For example, the processor may not cause the switch array to change the electrical configuration of the energy storage assemblies. In some implementations, once block 1064 is reached, process 1060 is not repeated until a change occurs in the electrical load and/or energy storage assemblies. For example, the electrical load can be changed to a different electrical load. In some implementations, once block 1064 is reached, process 1060 is not repeated until a change occurs in the energy storage assemblies. For example, the electrical configuration of the energy storage assemblies can be changed. In these implementations, process 1060 can restart at decision block 1062 when the change in the electrical load occurs.

At block 1066, the processor can update the electrical configuration of the energy management system. The processor can update the electrical configuration by causing the switch array to transition between electrical states. The processor can update the electrical configuration by causing the switch array to electrically couple one or more energy storage assemblies to the load. The processor can update the electrical configuration by causing the switch array to electrically couple one or more energy storage assemblies in series. The processor can update the electrical configuration by causing the switch array to electrically couple the load to a different energy storage assembly. The processor can update the electrical configuration by causing the switch array to electrically couple a different energy source to one or more energy storage assemblies. In some implementations, the processor can update the electrical configuration by generating instructions for a user to change the electrical configuration. For example, the processor may generate user interface data to render a user interface including instructions to a user to electrically decouple or couple one or more energy storage assemblies. A user may manually change electrical coupling between energy storage assemblies and/or loads as shown and/or described herein. The processor can cause the switch array to connect an additional energy storage assembly in a series electrical configuration. The energy storage assembly to be added can be selected based on user input and/or the available storage of the energy storage assemblies. After block 1066 has been executed process 1060 proceeds along feedback 1067 to decision block 1062 and the process 1060 can repeat until decision block 1062 is no longer satisfied and/or all available energy storage assemblies are included in the electrical configuration.

Figure 11:
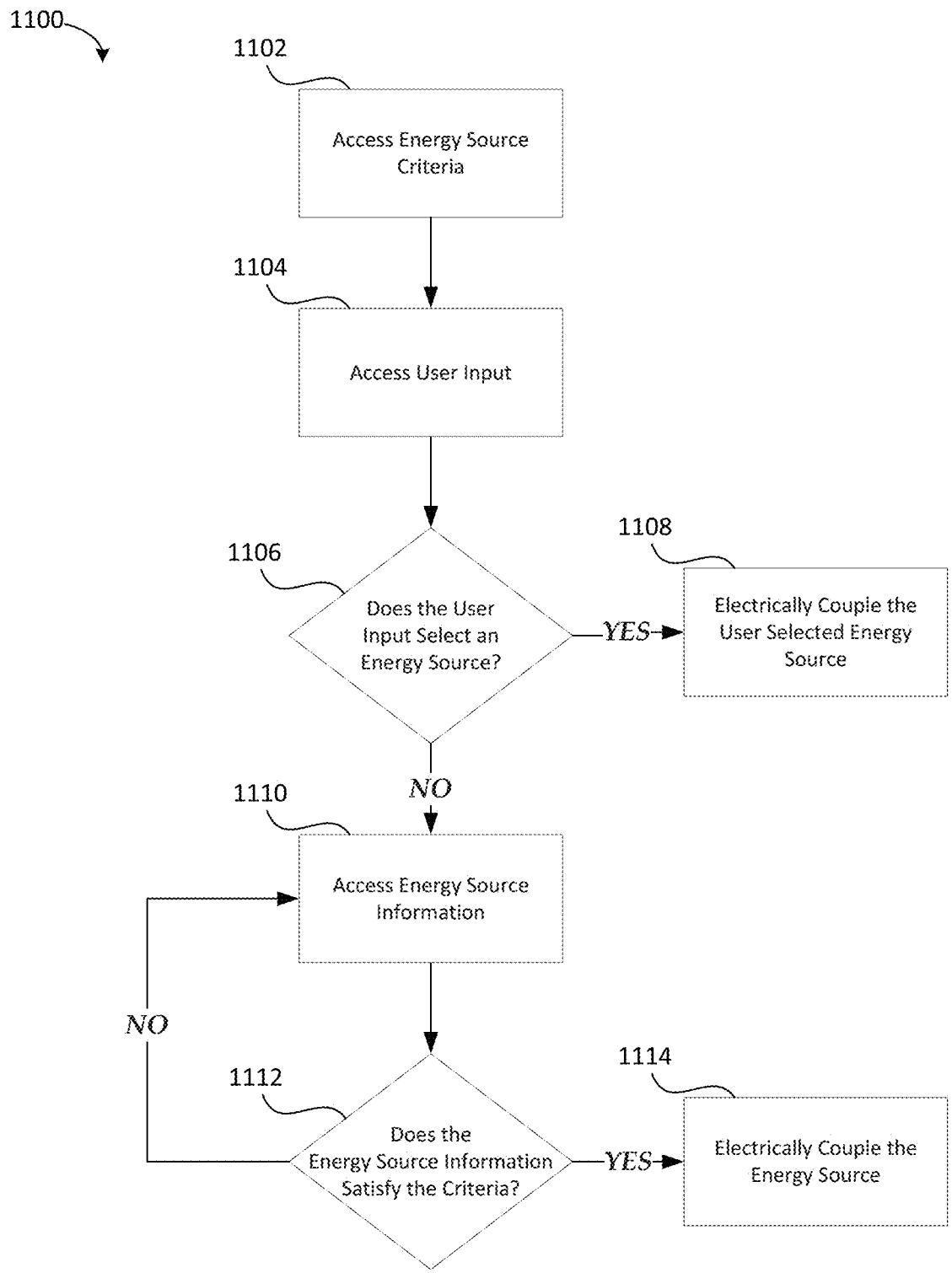
FIG. 11 is an example process for selecting an energy source.

FIG. 11 illustrates an example process 1100 for selecting an energy source. Process 1100, or portions thereof, can be executed by a hardware processor, such as processor(s) 910 shown and/or described herein. Process 1100, or portions thereof, can be implemented in an energy management system such as in any of the example energy management systems shown and/or described herein. Process 1100 is provided as an example and is not intended to be limiting of the present disclosure. In some implementations, the processor can omit portions of the process 1100, can add additional operations, and/or can rearrange an order in which the operations of the process 1100 are executed.

Process 1100 can be used by a processor, such as processor(s) 910 to determine, in part, an electrical configuration of the switch array. For example, process 1100 can be used to determine an energy source to charge one or more energy storage assemblies grouped in an electrical configuration. In some implementations, process 1100 can be used to determine an energy source to be passed through by the switch array to a connected electrical load.

At block 1102, the processor can access energy source criteria. The processor can access the energy source criteria from memory. The processor can receive the energy source criteria from one or more remote computing devices. The processor can receive the energy source criteria via user input. The energy source criteria can include data obtained by one or more sensors, such as voltage sensors 912 and/or current sensors 914. The energy source criteria can include data received from one or more data sources, such as data streamed from an Internet source or data received from remote servers, or databases. The energy source criteria can include voltage thresholds, power requirements, rate of charge requirements, energy source priority information, cost of energy thresholds, and any other parameter or criteria useful for selecting a power source from a plurality of power sources.

At block 1104, the processor can access user input. The processor can receive user input via a user terminal, such as any of the example user interfaces shown and/or described herein. The processor can receive user input from a remote device, such as a phone, laptop, tablet, vehicle computing device, wearable device. The user input can include energy source criteria. The user input can supplement the energy source criteria accessed at block 1102. The user input can also be used to override information originally received for the energy source criteria. The user input can include instructions. The user input can also include an energy source selection. In some instances, no user input is received. In these instances, process 1100 proceeds to block 1110.

At decision block 1106, the processor determines if the user input includes an energy source selection. If the processor determines that the user input does include an energy source selection, then process 1100 proceeds to block 1108. If the processor determines that the user input does not include an energy source selection, then process 1100 proceeds to block 1110.

At block 1108, the processor electrically connects the user selected energy source to one or more energy storage assemblies. For example, processor can cause a switch array to electrically connect the selected energy source to one or more energy storage assemblies or one or more electrical loads.

At block 1110, the processor can receive energy source information. The energy source information can include data obtained by one or more sensors, such as voltage sensors 912 and/or current sensors 914. The energy source information can include data received from one or more data sources, such as data streamed from an Internet source or data received from remote servers, or databases. The data received for the specific energy source can include voltage levels, power availability, rate of charge values, cost of energy of the energy source, and any other parameter useful for selecting a power source from a plurality of power sources.

At decision block 1112, the processor can determine if the energy source information satisfies the energy source criteria. The processor can analyze if the energy source information satisfies the energy source criteria by comparing the energy source criteria to the energy source information. As an example, the energy source criteria can include a voltage requirement, a minimum rate of charge, and a maximum cost of energy. In this example, the processor determines if the voltage of the energy source meets the voltage requirement, the rate of charge of the specific energy source exceeds the minimum rate of charge, and the cost of energy for the specific energy source is below the maximum cost of energy. If the processor determines that the information for the specific energy source satisfies the energy source criteria, process 1100 proceeds to block 1114. If the processor determines that the information for the specific energy source does not meet the energy source criteria, process 1100 reverts to block 1114 and can execute block 1110 again for a different energy source.

At block 1114, the processor can electrically couple the energy source to one or more energy storage assemblies. For example, processor can cause a switch array to electrically connect the selected energy source to one or more energy storage assemblies or one or more electrical loads. The processor can electrically couple the energy source to an energy storage assembly with the lowest charge. The processor can electrically couple the energy source to an energy storage assembly with the lowest voltage. The processor can electrically couple the energy source to multiple energy storage assemblies sequentially (e.g., one at a time, one after another). The processor can electrically couple the energy source to multiple energy storage assemblies sequentially in an order based on charge level or voltage level.

Figure 12:
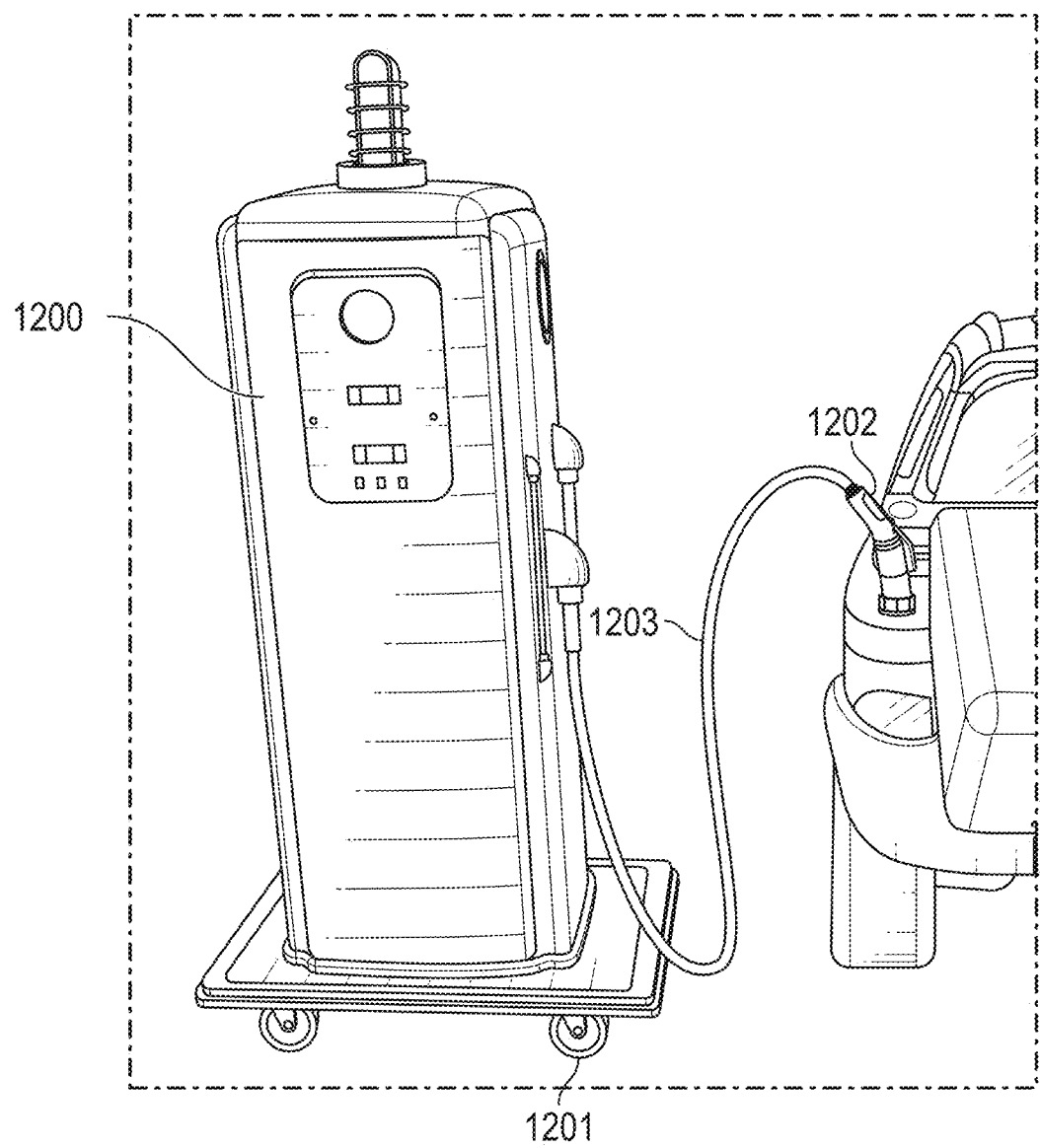
FIG. 12 illustrates an example implementation of an energy management system.

FIG. 12 illustrates an example implementation of an energy storage assembly 1200. Energy storage assembly 1200 can include similar structural and/or operational features as any of the other example energy storage assemblies shown and/or described herein. The energy storage assembly 1200 can include a capacitor such as an ultracapacitor and/or supercapacitor. The energy storage assembly 1200 can include an energy storage device such as a battery. The energy storage device can include lithium-ion battery or any other suitable type of battery. The energy storage device can be configured to receive energy from the capacitor.

The energy storage assembly 1200 can removably electrically connect to a power source such as a utility grid. The energy storage assembly 1200 can electrically couple to the power grid via a standard wall outlet, such as a 110V outlet or a 220V outlet. The energy storage assembly 1200 can receive energy from the power source to store in one or more components of the energy storage assembly 1200 such as in a capacitor and/or a battery.

The energy storage assembly 1200 can include a cable 1203. The cable 1203 can include electrically conductive material, such as wiring, capable of conducting high voltages and/or high amperages. For example, the cable 1203 may conduct 100 or more amperes. As another example, the cable 1203 may be able to conduct energy across more than a 100 voltage differential.

The energy storage assembly 1200 can include a charging plug 1202. The plug 1202 may be a fast charging plug, such as a level 2 or a level 3 charging plug. The plug 1202 may be configured to electrically couple to an electric-powered device, such as an electric vehicle, to charge the device. The energy storage assembly 1200 may connect to and charge other electric-powered devices such as household appliances.

The energy storage assembly 1200 may be able to provide large amounts of energy to charge electric devices in a short of time. The energy storage assembly 1200 may not require large amounts of energy storage in order to provide fast charging to electric devices. For example, the energy storage assembly 1200 may require no more than about 200V, 150V, or 100V of energy storage space such as in a battery. This may provide a significant advantage over existing charging systems, such as level 3 charging systems, which can require over 400 Volts of battery storage. In one example implementations the energy storage assembly 1200 can include about 150V of energy storage space in a battery and about 150V of energy storage space in a capacitor. As energy is drawn from the battery to charge an electric device, energy from the capacitor can feed into the battery to supplement the energy draw and to stabilize the battery voltage. This may prevent a voltage drop in the battery and thus allow the battery to continue to provide a voltage levels for fast charging of the electric device.

The energy storage assembly 1200 can include one or more wheels 1201. The energy storage assembly 1200 can be mobile or portable. The energy storage assembly 1200 may be easily moved from one location to another by rolling the energy storage assembly 1200 along the ground surface on the wheel(s) 1201. The portability of the energy storage assembly 1200 may facilitate charging the energy storage assembly 1200 and/or charging other devices from the energy storage assembly 1200.

Figure 13:
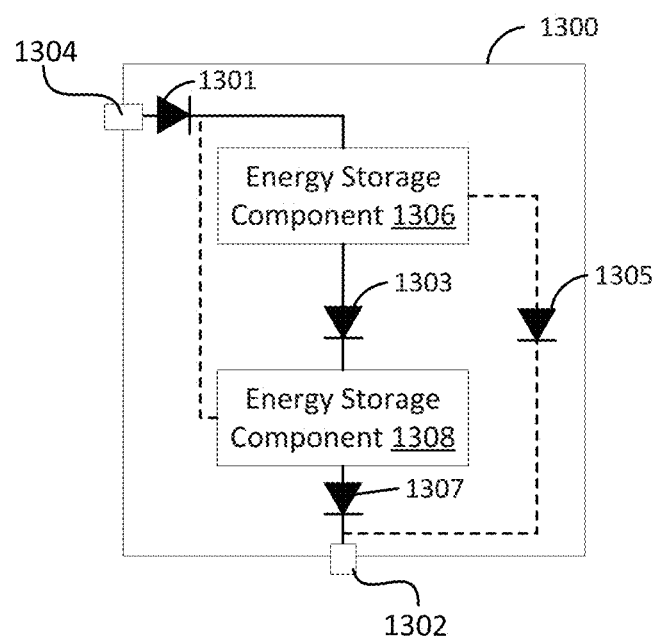
FIG. 13 is a schematic diagram illustrating an example implementation of an energy storage assembly.

FIG. 13 illustrates an example implementation of an energy storage assembly 1300. The energy storage assembly 1300 can include an energy storage component 1306. The energy storage component 1306 can include an ultracapacitor and/or a supercapacitor. The energy storage component 1306 may be configured to retain large amounts of energy such as 150 Volts or more. The energy storage assembly 1300 can include an energy storage component 1308. The energy storage component 1308 can include a battery. In some implementations, the energy storage component 1308 can include a lithium-based battery such as a lithium-ion battery and/or a lithium-polymer battery. In some implementations, the energy storage component 1308 can include a nickel-based battery. In some implementations, the energy storage component 1308 may not include a lithium-ion battery. The energy storage component 1308 may be configured to store large amounts of energy such as 150 Volts or more.

The energy storage assembly 1300 can include a terminal 1304. The terminal 1304 can removably mechanically and/or removably electrically couple to an energy source. The energy source can comprise any of the example energy sources discussed herein. The energy source can comprise another energy storage assembly. The terminal 1304 may connect to a 110V outlet or a 220V outlet. The energy storage assembly 1300 may receive energy from an energy source via the terminal 1304. The energy storage assembly 1300 may receive energy via the terminal 1304 in an alternating current or a direct current. The terminal 1304 may be electrically coupled with the energy storage component 1306. In some implementations, the terminal 1304 may be electrically coupled with the energy storage component 1308.

The energy storage assembly 1300 can include a diode 1301. The diode 1301 may be biased toward the energy storage component 1306. The diode 1301 may prevent a flow of energy out from the energy storage component 1306 such as toward the terminal 1304. The energy storage component 1306 may receive energy from an energy source via the diode 1301.

The energy storage assembly 1300 can include a diode 1303. The diode 1303 may be biased toward the energy storage component 1308. The diode 1303 may prevent a flow of energy from the energy storage component 1308 toward the energy storage component 1306. The energy storage component 1308 may receive energy from the energy storage component 1306 via the diode 1303. The energy storage component 1308 may be directly electrically coupled with the energy storage component 1306 via the diode 1303. The energy storage component 1308 may receive energy from the energy storage component 1306 whenever the voltage in the energy storage component 1306 exceeds a voltage in the energy storage component 1308. The energy storage component 1308 may receive energy from the energy storage component 1306 whenever a resistance in the diode 1303 falls below a threshold level such that the diode is opened and allows energy to flow therethrough.

The energy storage assembly 1300 can include a terminal 1302. The terminal 1302 can removably mechanically and/or removably electrically couple to an electrical load. The electrical load can comprise any of the example electrical loads discussed herein. The electrical load can comprise another energy storage assembly. The terminal 1302 may be a fast-charging connector such as a level 2 or a level 3 charging connector. The terminal 1302 may be removably electrically coupled with an electric-powered device such as an electric vehicle. The energy storage assembly 1300 may convey energy from the energy storage component 1308 to an electrical load via the terminal 1302. The terminal 1302 may be electrically coupled with the energy storage component 1308. In some implementations, the terminal 1302 may be electrically coupled with the energy storage component 1306.

The energy storage assembly 1300 can include a diode 1307. The diode 1307 may be biased toward the terminal 1302. The diode 1307 may prevent a flow of energy from the terminal 1302 toward the energy storage component 1308. The terminal 1302 may receive energy from the energy storage component 1308 via the diode 1307.

The energy storage assembly 1300 can include a diode 1305. The diode 1305 may be biased toward the terminal 1302. The diode 1305 may prevent a flow of energy from the terminal 1302 toward the energy storage component 1306. The terminal 1302 may receive energy from the energy storage component 1306 via the diode 1305.

The energy storage assembly 1300 may convey energy via the terminal 1302 in an alternating or a direct current. In some implementations, the energy storage assembly 1300 may convey 100 or more amperes of energy via the terminal 1302 such as in a direct current. In some implementations, the energy storage assembly 1300 may provide 1 Kilowatt of power via the terminal 1302 in about 15-20 minutes. In some implementations, the energy storage assembly 1300 may provide 1.5 Kilowatts of power via the terminal 1302 in about 25-30 minutes.

Additional Implementations

As used herein, "real-time" or "substantial real-time" may refer to events (e.g., receiving, processing, transmitting, displaying etc.) that occur at the same time or substantially the same time (e.g., neglecting any small delays such as those that are imperceptible to humans such as delays arising from electrical conduction or transmission). As a non-limiting example, "real-time" may refer to events that occur within a time frame of each other that is on the order of milliseconds, seconds, tens of seconds, or minutes. In some implementations, "real-time" may refer to events that occur at a same time as, or during, another event.

As used herein, "system," "instrument," "apparatus," and "device" generally encompass both the hardware (for example, mechanical and electronic) and, in some implementations, associated software (for example, specialized computer programs for graphics control) components.

It is to be understood that not necessarily all objects or advantages may be achieved in accordance with any particular implementation described herein. Thus, for example, those skilled in the art will recognize that certain implementations may be configured to operate in a manner that achieves or optimizes one advantage or group of advantages as taught herein without necessarily achieving other objects or advantages as may be taught or suggested herein.

Each of the processes, methods, and algorithms described in the preceding sections may be embodied in, and fully or partially automated by, code modules executed by one or more computer systems or computer processors including computer hardware. The code modules may be stored on any type of non-transitory computer-readable medium or computer storage device, such as hard drives, solid state memory, optical disc, and/or the like. The systems and modules may also be transmitted as generated data signals (for example, as part of a carrier wave or other analog or digital propagated signal) on a variety of computer-readable transmission mediums, including wireless-based and wired/cable-based mediums, and may take a variety of forms (for example, as part of a single or multiplexed analog signal, or as multiple discrete digital packets or frames). The processes and algorithms may be implemented partially or wholly in application-specific circuitry. The results of the disclosed processes and process steps may be stored, persistently or otherwise, in any type of non-transitory computer storage such as, for example, volatile or non-volatile storage.

Many other variations than those described herein will be apparent from this disclosure. For example, depending on the implementation, certain acts, events, or functions of any of the algorithms described herein can be performed in a different sequence, can be added, merged, or left out altogether (for example, not all described acts or events are necessary for the practice of the algorithms). Moreover, in certain implementations, acts or events can be performed concurrently, for example, through multi-threaded processing, interrupt processing, or multiple processors or processor cores or on other parallel architectures, rather than sequentially. In addition, different tasks or processes can be performed by different machines and/or computing systems that can function together.

The various illustrative logical blocks, modules, and algorithm elements described in connection with the implementations disclosed herein can be implemented as electronic hardware, computer software, or combinations of both. To clearly illustrate this interchangeability of hardware and software, various illustrative components, blocks, modules, and elements have been described herein generally in terms of their functionality. Whether such functionality is implemented as hardware or software depends upon the particular application and design constraints imposed on the overall system. The described functionality can be implemented in varying ways for each particular application, but such implementation decisions should not be interpreted as causing a departure from the scope of the disclosure.

The various features and processes described herein may be used independently of one another, or may be combined in various ways. All possible combinations and sub-combinations are intended to fall within the scope of this disclosure. In addition, certain method or process blocks may be omitted in some implementations. The methods and processes described herein are also not limited to any particular sequence, and the blocks or states relating thereto can be performed in other sequences that are appropriate. For example, described blocks or states may be performed in an order other than that specifically disclosed, or multiple blocks or states may be combined in a single block or state. The example blocks or states may be performed in serial, in parallel, or in some other manner. Blocks or states may be added to or removed from the disclosed example implementations. The example systems and components described herein may be configured differently than described. For example, elements may be added to, removed from, or rearranged compared to the disclosed example implementations.

The various illustrative logical blocks and modules described in connection with the implementations disclosed herein can be implemented or performed by a machine, such as a general purpose processor, a digital signal processor ("DSP"), an application specific integrated circuit ("ASIC"), a field programmable gate array ("FPGA") or other programmable logic device, discrete gate or transistor logic, discrete hardware components, or any combination thereof designed to perform the functions described herein. A general purpose processor can be a microprocessor, but in the alternative, the processor can be a controller, microcontroller, or state machine, combinations of the same, or the like. A processor can include electrical circuitry configured to process computer-executable instructions. In another implementation, a processor includes an FPGA or other programmable devices that performs logic operations without processing computer-executable instructions. A processor can also be implemented as a combination of computing devices, for example, a combination of a DSP and a microprocessor, a plurality of microprocessors, one or more microprocessors in conjunction with a DSP core, or any other such configuration. Although described herein primarily with respect to digital technology, a processor may also include primarily analog components. For example, some, or all, of the signal processing algorithms described herein may be implemented in analog circuitry or mixed analog and digital circuitry. A computing environment can include any type of computer system, including, but not limited to, a computer system based on a microprocessor, a mainframe computer, a digital signal processor, a portable computing device, a device controller, or a computational engine within an appliance, to name a few.

The elements of a method, process, or algorithm described in connection with the implementations disclosed herein can be embodied directly in hardware, in a software module stored in one or more memory devices and executed by one or more processors, or in a combination of the two. A software module can reside in RAM memory, flash memory, ROM memory, EPROM memory, EEPROM memory, registers, hard disk, a removable disk, a CD-ROM, or any other form of non-transitory computer-readable storage medium, media, or physical computer storage known in the art. An example storage medium can be coupled to the processor such that the processor can read information from, and write information to, the storage medium. In the alternative, the storage medium can be integral to the processor. The storage medium can be volatile or nonvolatile. The processor and the storage medium can reside in an ASIC. The ASIC can reside in a user terminal. In the alternative, the processor and the storage medium can reside as discrete components in a user terminal.

Conditional language, such as, among others, "can," "could," "might," or "may," unless specifically stated otherwise, or otherwise understood within the context as used, is generally intended to convey that certain implementations include, while other implementations do not include, certain features, elements and/or steps. Thus, such conditional language is not generally intended to imply that features, elements and/or steps are in any way required for one or more implementations or that one or more implementations necessarily include logic for deciding, with or without user input or prompting, whether these features, elements and/or steps are included or are to be performed in any particular implementation.

Disjunctive language such as the phrase "at least one of X, Y, or Z," unless specifically stated otherwise, is otherwise understood with the context as used in general to present that an item, term, and so forth, may be either X, Y, or Z, or any combination thereof (for example, X, Y, and/or Z). Thus, such disjunctive language is not generally intended to, and should not, imply that certain implementations require at least one of X, at least one of Y, or at least one of Z to each be present.

Any process descriptions, elements, or blocks in the flow diagrams described herein and/or depicted in the attached figures should be understood as potentially representing modules, segments, or portions of code which include one or more executable instructions for implementing specific logical functions or steps in the process. Alternate implementations are included within the scope of the implementations described herein in which elements or functions may be deleted, executed out of order from that shown or discussed, including substantially concurrently or in reverse order, depending on the functionality involved, as would be understood by those skilled in the art.

Unless otherwise explicitly stated, articles such as "a" or "an" should generally be interpreted to include one or more described items. Accordingly, phrases such as "a device configured to" are intended to include one or more recited devices. Such one or more recited devices can also be collectively configured to carry out the stated recitations. For example, "a processor configured to carry out recitations A, B and C" can include a first processor configured to carry out recitation A working in conjunction with a second processor configured to carry out recitations B and C.

All of the methods and processes described herein may be embodied in, and partially or fully automated via, software code modules executed by one or more general purpose computers. For example, the methods described herein may be performed by the computing system and/or any other suitable computing device. The methods may be executed on the computing devices in response to execution of software instructions or other executable code read from a tangible computer readable medium. A tangible computer readable medium is a data storage device that can store data that is readable by a computer system. Examples of computer readable mediums include read-only memory, random-access memory, other volatile or non-volatile memory devices, CD-ROMs, magnetic tape, flash drives, and optical data storage devices.

It should be emphasized that many variations and modifications may be made to the herein-described implementations, the elements of which are to be understood as being among other acceptable examples. All such modifications and variations are intended to be included herein within the scope of this disclosure. The section headings used herein are merely provided to enhance readability and are not intended to limit the scope of the implementations disclosed in a particular section to the features or elements disclosed in that section. The foregoing description details certain implementations. It will be appreciated, however, that no matter how detailed the foregoing appears in text, the systems and methods can be practiced in many ways. As is also stated herein, it should be noted that the use of particular terminology when describing certain features or aspects of the systems and methods should not be taken to imply that the terminology is being re-defined herein to be restricted to including any specific characteristics of the features or aspects of the systems and methods with which that terminology is associated.

Those of skill in the art would understand that information, messages, and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

What is claimed is:

1. An energy management system configured to store energy received from an energy source and provide energy to an electrical load, the energy management system comprising:
a housing comprising:
a plurality of wheels positioned on a bottom surface of the housing, the plurality of wheels configured to facilitate rolling the housing along a ground surface;
an interior region accessible via one or more openings on a surface of the housing; and
one or more guide tracks comprising one or more first terminals and one or more second terminals, the one or more guide tracks positioned on one or more side walls within the interior region; and
a first energy storage assembly configured to:
removably insert into the interior region of the housing via the one or more openings of the surface of the housing, at least a portion of the first energy storage assembly being accessible from an exterior of the housing when the first energy storage assembly is removably inserted within the interior region of the housing, the portion of the first energy storage assembly comprising a handle configured for a user to push or pull the energy storage assembly along the one or more guide tracks within the interior region;
removably physically couple to the one or more guide tracks positioned on the one or more side walls within the interior region of the housing; and
removably electrically couple to the one or more first terminals of the one or more guide tracks within the interior region of the housing;
a second energy storage assembly configured to:
removably insert into the interior region of the housing via the one or more openings positioned of the surface of the housing;
removably physically couple to the one or more guide tracks positioned on the one or more side walls within the interior region of the housing; and
removably electrically couple to the one or more second terminals of the one or more guide tracks within the interior region of the housing;
one or more switches disposed within the interior region of housing, the one or more switches configured to transition between a plurality of states, the one or more switches in electrical communication with:
the one or more first terminals; and
the one or more second terminals; and
one or more hardware processors configured to execute program instructions to:

responsive to an energy demand from an electrical load electrically coupled to the energy management system, cause the one or more switches to electrically couple the one or more first terminals to the one or more second terminals to cause the first energy storage assembly to couple to the second energy storage assembly in series to increase a voltage provided to the electrical load; and responsive to an energy supply from an energy source electrically coupled to the energy management system, cause the one or more switches to electrically disconnect the one or more first terminals from the one or more second terminals to increase an energy received from the energy source at the energy management system, wherein the housing includes electrically insulative material.

2. The energy management system of claim 1, wherein the one or more hardware processors is further configured to execute the program instructions to:

cause the one or more switches to electrically couple the one or more first terminals to the one or more second terminals or electrically disconnect the one or more first terminals from the one or more second terminals based on at least sensor information.

3. The energy management system of claim 1, wherein the one or more hardware processors is further configured to execute the program instructions to:

cause the one or more switches to electrically couple the one or more first terminals to the one or more second terminals or electrically disconnect the one or more first terminals from the one or more second terminals based on at least a voltage of the energy source.

4. The energy management system of claim 1, wherein the one or more hardware processors is further configured to execute the program instructions to:

cause the one or more switches to electrically couple the one or more first terminals to the one or more second terminals or electrically disconnect the one or more first terminals from the one or more second terminals based on at least a voltage of the first energy storage assembly.

5. The energy management system of claim 1, wherein the one or more hardware processors is further configured to execute the program instructions to:

cause the one or more switches to electrically couple the one or more first terminals to the one or more second terminals or electrically disconnect the one or more first terminals from the one or more second terminals based on at least a voltage of the second energy storage assembly.

6. The energy management system of claim 1, wherein the one or more hardware processors is further configured to execute the program instructions to:

cause the one or more switches to electrically couple the one or more first terminals to the one or more second terminals or electrically disconnect the one or more first terminals from the one or more second terminals based on at least energy requirements of the electrical load.

7. The energy management system of claim 1, wherein the one or more hardware processors is further configured to execute the program instructions to:

cause the one or more switches to electrically couple the one or more first terminals to the one or more second terminals or electrically disconnect the one or more first terminals from the one or more second terminals based on at least a user input.

8. The energy management system of claim 1, wherein the one or more hardware processors is further configured to execute the program instructions to:

cause the one or more switches to electrically couple the first energy storage assembly to the second energy storage assembly in parallel.

9. The energy management system of claim 1, wherein the one or more hardware processors is further configured to execute the program instructions to:

generate user interface data for rendering one or more user interfaces on a display screen, the one or more user interfaces including data relating to an operation of the energy management system; and communicate the user interface data to a mobile electronic device comprising the display screen, the mobile electronic device configured to render the one or more user interfaces on the display screen.

10. The energy management system of claim 1, wherein the one or more hardware processors is further configured to execute the program instructions to:

generate instructions to a user to physically couple a third energy storage assembly to the housing.

11. The energy management system of claim 1, wherein the one or more hardware processors is further configured to execute the program instructions to:

generate instructions to a user to physically decouple the first or second energy storage assembly from the housing.

12. The energy management system of claim 1, further comprising a third energy storage assembly in electrical communication with the one or more switches and configured to:

removably physically couple within the housing; and
removably electrically couple to one or more third terminals disposed on the housing, wherein the one or more hardware processors is further configured to execute the program instructions to:

cause the one or more switches to electrically couple the one or more first terminals, the one or more second terminals, and the one or more third terminals in series.

13. The energy management system of claim 1, further comprising a third energy storage assembly in electrical communication with the one or more switches and configured to:

removably physically couple within the housing; and
removably electrically couple to one or more third terminals disposed on the housing, wherein the one or more hardware processors is further configured to execute the program instructions to:

cause the one or more switches to electrically couple the one or more first terminals to the one or more third terminals in series; and cause the one or more switches to electrically disconnect the one or more second terminals from the one or more first terminals and the one or more third terminals.

14. The energy management system of claim 1, wherein the first energy storage assembly has a higher power density than the second energy storage assembly, wherein the first energy storage assembly has a lower energy density than the second energy storage assembly.

15. The energy management system of claim 1, wherein the first energy storage assembly includes a capacitor, wherein the second energy storage assembly includes a battery.

16. The energy management system of claim 1, wherein the first energy storage assembly has a same power density as the second energy storage assembly, wherein the first energy storage assembly has a same energy density as the second energy storage assembly.

17. The energy management system of claim 1, wherein the first energy storage assembly includes a capacitor and battery, wherein the second energy storage assembly includes a capacitor and a battery.

18. The energy management system of claim 1 further comprising a display screen disposed on the housing, wherein the one or more hardware processors is further configured to execute the program instructions to:
generate user interface data for rendering one or more user interfaces on the display screen, the user interface data including data relating to an operation of the energy management system; and
cause the display screen to display the one or more user interfaces from the user interface data.

19. A method of storing energy received from an energy source and providing energy to an electrical load, the method comprising:
removably physically coupling a first energy storage assembly to a housing of an energy management system by one or more first guide tracks comprising one or more first terminals, the one or more first guide tracks positioned on one or more side walls within an interion region of the housing;
removably electrically coupling the first energy storage assembly to the one or more first terminals;
removably physically coupling a second energy storage assembly to the housing by one or more second guide tracks comprising one or more second terminals, the one or more second guide tracks positioned on one or more side walls within an interion region of the housing;
removably electrically coupling the second energy storage assembly to the one or more second terminals disposed on the housing; and
under control of one or more hardware processors:
responsive to an energy demand from an electrical load electrically coupled to the energy management system, causing one or more switches to electrically couple the one or more first terminals to the one or more second terminals to cause the first energy storage assembly to couple to the second energy storage assembly in series to increase a voltage provided to the electrical load;
responsive to an energy supply from an energy source electrically coupled to the energy management system, causing the one or more switches to electrically disconnect the one or more first terminals from the one or more second terminals to increase an energy received from the energy source at the energy management system;
generating user interface data for rendering one or more user interfaces on a display screen, the one or more user interfaces including data relating to an electrical configuration of one or more switches of the energy management system;
communicating the user interface data to a mobile electronic device comprising the display screen, the mobile electronic device configured to render the one or more user interfaces on the display screen, wherein the one or more user interfaces comprises an interactive graphical user interface;
responsive to a user input via the interactive graphical user interface, causing the one or more switches to electrically couple the one or more first terminals to the one or more second terminals to cause the first energy storage assembly to couple to the second energy storage assembly in series to increase a voltage output; and
responsive to a user input via the interactive graphical user interface, causing the one or more switches to electrically disconnect the one or more first terminals from the one or more second terminals.

20. The method of claim 19, further comprising:
electrically coupling the one or more first terminals to the one or more second terminals or electrically disconnecting the one or more first terminals from the one or more second terminals based on at least sensor information.

21. The method of claim 19, further comprising under control of the one or more hardware processors:
causing the one or more switches to electrically couple the one or more first terminals to the one or more second terminals or to electrically disconnect the one or more first terminals from the one or more second terminals based on at least a user input.

22. The method of claim 19, further comprising under control of the one or more hardware processors:
causing the one or more switches to electrically couple the first energy storage assembly to the second energy storage assembly in parallel.

23. The method of claim 19, further comprising under control of the one or more hardware processors:
generating instructions to a user to physically couple a third energy storage assembly to the housing.

24. The method of claim 19, further comprising communicating the user interface data to another display screen disposed on the housing.

* * * * *